US012727154B2

(12) United States Patent
Jung et al.

(10) Patent No.: US 12,727,154 B2
(45) Date of Patent: Sep. 1, 2026

(54) SEMICONDUCTOR DEVICE

(71) Applicant: Samsung Electronics Co., Ltd., Suwon-si (KR)

(72) Inventors: Hyeonok Jung, Daejeon (KR); Donghwa Shin, Gwangju (KR); Hoin Ryu, Suwon-si (KR); Youngseung Cho, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 502 days.

(21) Appl. No.: 17/970,799

(22) Filed: Oct. 21, 2022

(65) Prior Publication Data

US 2023/0247825 A1 Aug. 3, 2023

(30) Foreign Application Priority Data

Jan. 28, 2022 (KR) ........................ 10-2022-0013201

(51) Int. Cl.
*H10B 12/00* (2023.01)

(52) U.S. Cl.
CPC ........... *H10B 12/50* (2023.02); *H10B 12/315* (2023.02)

(58) Field of Classification Search
CPC ....... H10B 12/50; H10B 12/09; H10B 12/315
See application file for complete search history.

(56) References Cited

U.S. PATENT DOCUMENTS 8,772,056 B2 7/2014 Wang et al.
9,450,044 B2 9/2016 Lin et al.
9,548,310 B2 1/2017 Kaneko et al.
10,128,329 B2 11/2018 Lin et al.
10,868,112 B2 12/2020 Lin et al.
11,106,854 B2 8/2021 Chuang et al.
11,502,181 B2 11/2022 Huang
11,562,958 B2 1/2023 Huang
11,894,420 B2 * 2/2024 Zhang .................... H10B 12/09
2007/0296045 A1 * 12/2007 Tanaka ................. H10D 30/608 257/E29.267
2016/0233297 A1 * 8/2016 Tomoyama ........... H01L 21/762
2020/0203215 A1 * 6/2020 Jang .................. H01L 21/76229
2020/0312952 A1 * 10/2020 Cho ....................... H10D 1/692
2021/0082924 A1 3/2021 Seong et al.
2021/0091176 A1 3/2021 Lin et al.
(Continued)

FOREIGN PATENT DOCUMENTS

CN 113314534 A 8/2021
KR 1020110076502 A 7/2011
KR 10-2016-0022744 B1 7/2017
(Continued)

*Primary Examiner* — Ori Nadav
(74) *Attorney, Agent, or Firm* — Muir Patent Law, PLLC

(57) ABSTRACT

A semiconductor device may include a substrate extending in a first direction and a second direction perpendicular to the first direction, the substrate including a memory cell region, a peripheral circuit region, and a boundary region between the memory cell region and the peripheral circuit region, first active patterns in the memory cell region, each of the first active patterns extending in a third direction oblique to the first direction, and a silicon dam structure in the boundary region. The silicon dam structure may include a silicon dam pattern including trench lines extending in the oblique direction and a dam isolation pattern in the trench lines.

18 Claims, 33 Drawing Sheets

(56) References Cited

U.S. PATENT DOCUMENTS

| | | | |
|---|---|---|---|
| 2021/0167178 | A1 | 6/2021 | Kundu et al. |
| 2021/0175232 | A1 | 6/2021 | Nam et al. |

FOREIGN PATENT DOCUMENTS

| | | | |
|---|---|---|---|
| KR | 20210032843 | A | 3/2021 |
| TW | 202115830 | A | 4/2021 |
| TW | 202119556 | A | 5/2021 |

* cited by examiner 180c
170c
C
B
A
185a
184b
181b
180c
170c
150a
170a
172a
182b
183a
181a
THIRD DIRECTION
SECOND DIRECTION
FIRST DIRECTION A
B
C
150a
170a
180c
170c
172a
180a
182b
182a
185a
184b
181b
FIRST DIRECTION
THIRD DIRECTION
SECOND DIRECTION
180c
170c

FIG. 7

180c
170c
180b
184a
184b
C
B
A
180c
170c
150a
170a
172a
180a
182b
182a
THIRD DIRECTION
SECOND DIRECTION
FIRST DIRECTION

FIG. 8

A
B
C
180c
170c
184a
184b
180b
180c
170c
150a
170a
172a
181a
182b
183a
FIRST DIRECTION
THIRD DIRECTION
SECOND DIRECTION

FIG. 9

180c
170c
181b
185a
184b
C
B
A
180c
170c
150a
170a
172a
181a
182b
183a
THIRD DIRECTION
SECOND DIRECTION
FIRST DIRECTION

A
B
C
180c
170c
185a
184b
181b
150a
170a
172a
182b
182a
180a
FIRST DIRECTION
THIRD DIRECTION
SECOND DIRECTION

FIG. 13

A
B
C
180c
170c
184a
184b
180b
150a
170a
172a
182b
189a
187a
FIRST DIRECTION
THIRD DIRECTION
SECOND DIRECTION

FIG. 32

SEMICONDUCTOR DEVICE

CROSS-REFERENCE TO RELATED APPLICATION

This application claims priority under 35 USC § 119 to Korean Patent Application No. 10-2022-0013201, filed on Jan. 28, 2022, in the Korean Intellectual Property Office (KIPO), the contents of which are incorporated by reference herein in their entirety.

BACKGROUND

1. Field

Embodiments relate to a semiconductor device. More particularly, the embodiments relate to a semiconductor device including a memory cell region, a peripheral circuit region, and a boundary region between the memory cell region and the peripheral circuit region.

2. Description of the Related Art

The semiconductor device may include a memory cell region, a peripheral circuit region, and a boundary region between the memory cell region and the peripheral circuit region. An isolation structure to provide for electrical isolation between the memory cell region and the peripheral circuit region may be formed at a substrate in the boundary region. The isolation structure may include an insulation material filling an isolation trench of the substrate. The insulation material filling the isolation trench in the boundary region may have excellent gap filling characteristic. The insulation material filling the isolation trench in the boundary region may be densified by a heat treatment process. A volume of the insulation material may be decreased by the heat treatment process, so that stress may be generated in regions of the substrate adjacent to the boundary region.

SUMMARY

Example embodiments provide a semiconductor device having improved structural characteristics.

According to example embodiments, there may be provided a semiconductor device. The semiconductor device may include a substrate extending in a first direction and a second direction perpendicular to the first direction, the substrate including a memory cell region, a peripheral circuit region, and a boundary region between the memory cell region and the peripheral circuit region, first active patterns in the memory cell region, each of the first active patterns extending in a third direction oblique to the first direction, and a silicon dam structure in the boundary region. The silicon dam structure may include a silicon dam pattern including trench lines extending in the third direction and a dam isolation pattern in the trench lines.

According to example embodiments, there may be provided a semiconductor device. The semiconductor device may include a substrate extending in a first direction and a second direction perpendicular to the first direction, the substrate including a memory cell region, a peripheral circuit region, and a boundary region between the memory cell region and the peripheral circuit region, and first active patterns in the memory cell region, each of the first active patterns extending in a third direction oblique to the first direction, a first silicon dam structure extending in the second direction and positioned in the boundary region adjacent to an edge portion of the memory cell region in the first direction. The first silicon dam structure including a first silicon dam pattern including first trench lines extending in the third direction and a first dam isolation pattern in the first trench lines. A second silicon dam structure extending in the first direction and positioned in the boundary region adjacent to an edge portion of the memory cell region in the second direction. The second silicon dam structure including a second silicon dam pattern including second trench lines extending in the third direction and a second dam isolation pattern in the second trench lines.

According to example embodiments, there may be provided a semiconductor device. The semiconductor device may include a substrate extending in a first direction and a second direction perpendicular to the first direction, the substrate including a memory cell region, a peripheral circuit region, and a boundary region between the memory cell region and the peripheral circuit region, and first active patterns in the memory cell region, each of the first active patterns extending in a third direction oblique to the first direction. A first silicon dam structure extending in the second direction and positioned in the boundary region adjacent to an edge portion of the memory cell region in a first direction, the first silicon dam structure including a first silicon dam pattern including first trench lines extending in the third direction and a first dam isolation pattern in the first trench lines. A second silicon dam structure extending in the first direction and positioned in the boundary region adjacent to an edge portion of the memory cell region in the second direction, the second silicon dam structure including a second silicon dam pattern including second trench lines extending in the third direction and a second dam isolation pattern in the second trench lines. A gate structure in the memory cell region, bit line structures in the memory cell region, a contact plug structure disposed between the bit line structures in the memory cell region, and a capacitor on the contact structure, the capacitor being electrically connected to the contact plug structure.

In the semiconductor device in accordance with example embodiments, the silicon dam structure may be formed in the boundary region. Therefore, in the boundary region, an area occupied by the isolation pattern including a filling insulation pattern may be decreased. An amount (i.e., volume) of the isolation pattern in the boundary region may be decreased and, therefore, defects generated by the heat treatment process of the filling insulation pattern in the isolation pattern may be decreased.

BRIEF DESCRIPTION OF THE DRAWINGS

Example embodiments will be more clearly understood from the following detailed description taken in conjunction with the accompanying drawings. FIGS. 1 to 33 represent non-limiting, example embodiments as described herein.

FIG. 1 is a plan view illustrating active patterns in a semiconductor device in accordance with example embodiments;

FIG. 2 is a cross-sectional view taken along line I-I' of FIG. 1, and illustrating a first active pattern and a first silicon dam structure in a semiconductor device in accordance with example embodiments;

FIG. 3 is a cross-sectional view taken along line II-II' of FIG. 1, and illustrating a second silicon dam structure in a semiconductor device in accordance with example embodiments;

FIGS. 4 to 6 are plan views illustrating semiconductor devices in accordance with example embodiments, respectively;

FIGS. 7 to 10 are plan views illustrating semiconductor devices in accordance with example embodiments, respectively;

FIGS. 11 and 12 are plan views of semiconductor devices in accordance with example embodiments, respectively;

FIGS. 13 and 14 are plan views of semiconductor devices in accordance with example embodiments, respectively;

FIGS. 15 to 31 are cross-sectional views and plan views illustrating a method of forming active patterns in a semiconductor device in accordance with example embodiments;

FIG. 32 is a plan view illustrating a semiconductor device in accordance with example embodiments; and FIG. 33 is a cross-sectional view illustrating a portion of a semiconductor device in accordance with example embodiments.

DESCRIPTION OF EMBODIMENTS

Hereinafter, a direction parallel to a surface of a substrate surface may be referred to as a first direction, and a direction parallel to the surface of the substrate and perpendicular to the first direction may be referred to as a second direction. In addition, a direction parallel to the surface of the substrate and oblique with respect to the first direction may be referred to as a third direction. The third direction may be a longitudinal direction of an active pattern in a memory cell region.

Figure 1:
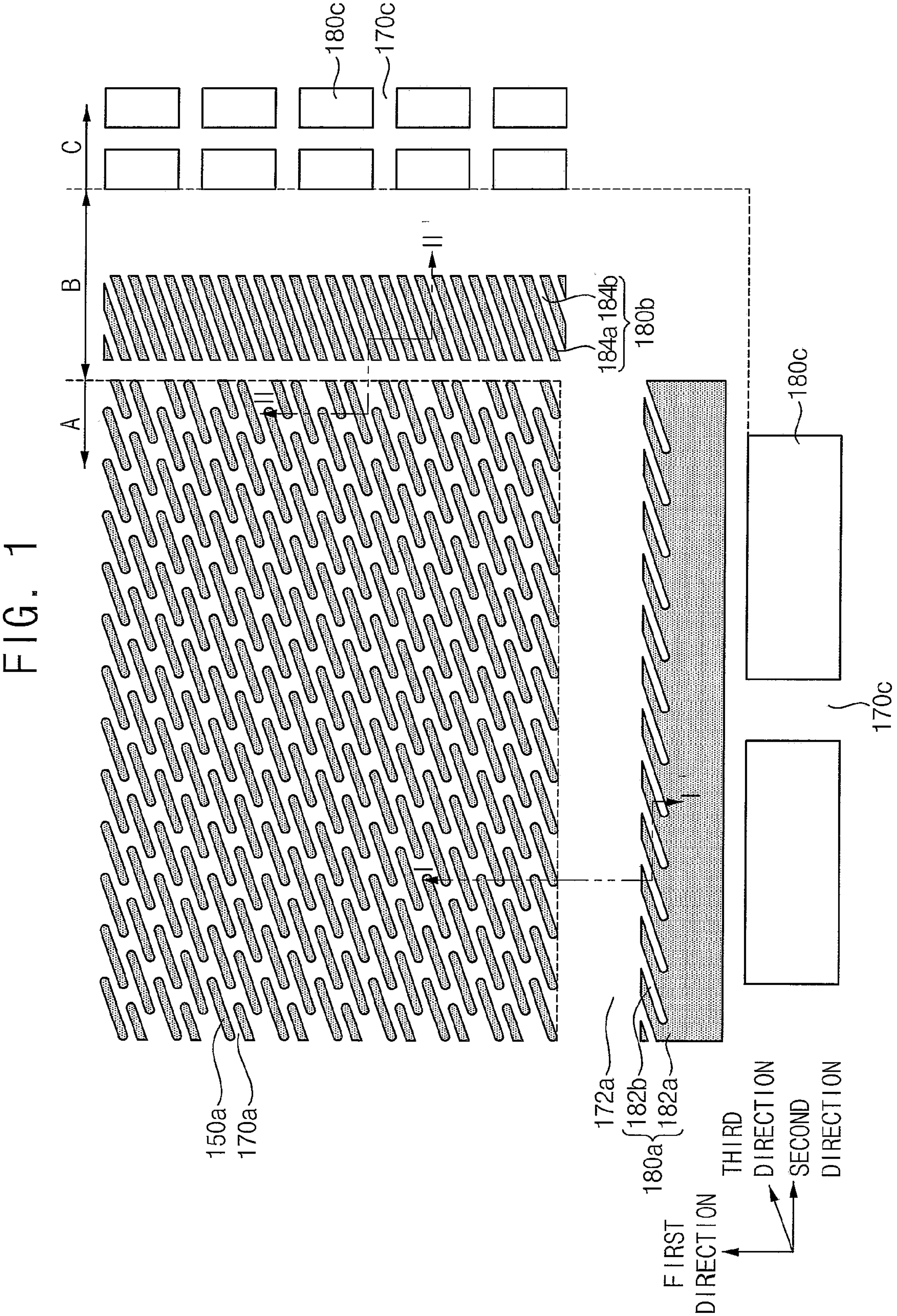
Figure 2:
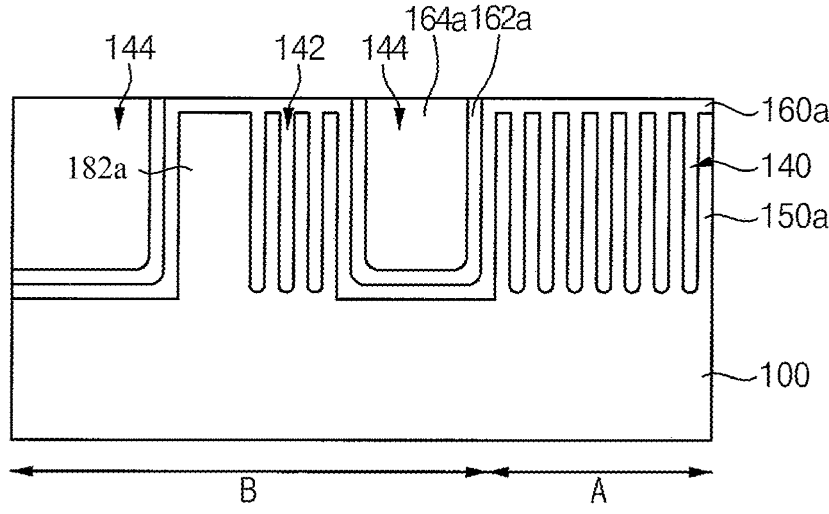
Figure 3:
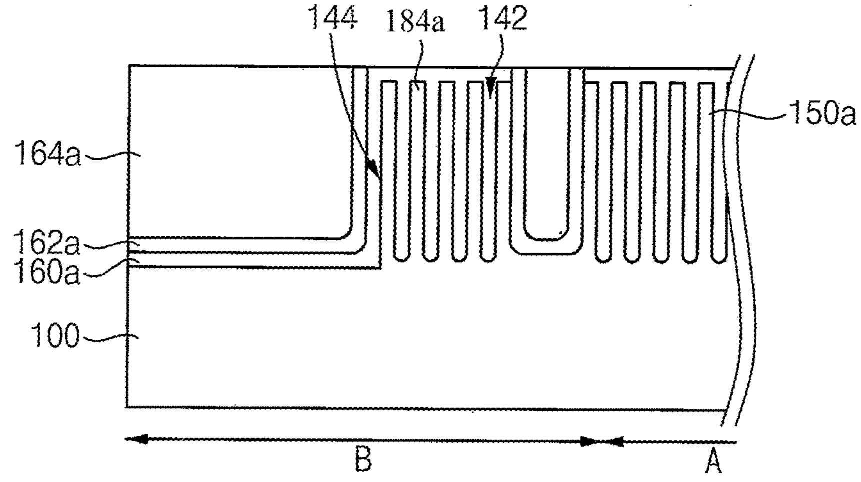

FIG. 1 is a plan view illustrating active patterns in a semiconductor device in accordance with example embodiments. FIG. 2 is a cross-sectional view illustrating a first active pattern and a first silicon dam structure in the semiconductor device of FIG. 1. FIG. 3 is a cross-sectional view illustrating a second silicon dam structure in the semiconductor device of FIG. 1.

FIG. 1 illustrates active patterns of each region in a DRAM device.

FIG. 2 is a cross-sectional view taken along line I-I' of FIG. 1, and FIG. 3 is a cross-sectional view taken along line II-II' of FIG. 1.

Referring to FIGS. 1 to 3, a substrate 100 may include a memory cell region A, a peripheral circuit region C, and a boundary region B between the memory cell region A and the peripheral circuit region C.

The peripheral circuit region C may be spaced apart from an edge portion of the memory cell region A, and may surround the memory cell region A. The peripheral circuit region C may include a first peripheral circuit region being spaced apart from an edge in the first direction in the memory cell region A and a second peripheral circuit region being spaced apart from an edge in the second direction in the memory cell region A. A sub word line drive SWD being electrically connected to word lines of the memory cell region A may be disposed in the first peripheral circuit region. A sense amplifier being electrically connected to bit lines of the memory cell region A may be disposed in the second peripheral circuit region.

The boundary region B may include a first boundary region between the memory cell region A and the first peripheral circuit region and a second boundary region between the memory cell region A and the second peripheral circuit region.

The substrate 100 may include trenches, and an insulation material may fill the trenches to form an isolation pattern. A region on which the isolation pattern is formed may serve as an isolation region. A protruding portion of the substrate between the trenches may be defined as an active pattern. An exposed upper portion of the active pattern may serve as an active region.

A first isolation pattern **170*a* and first active patterns 150*a* may be formed at the substrate 100 in the memory cell region A. A second isolation pattern 172*a* and silicon dam structures 180*a* and 180*b* may be formed at the substrate 100 in the boundary region B. A third isolation pattern 170*c* and a second active pattern 180*c* may be formed at the substrate 100** in the peripheral circuit region C. As used herein, the term "at the substrate" may refer to above the substrate or within the substrate. The term "substrate" may denote a substrate itself, or a stack structure including a substrate and predetermined layers or films formed on a surface of the substrate. In addition, the term "surface of a substrate" may denote an exposed surface of the substrate itself, or an external surface of a predetermined layer or a film formed on the substrate.

Each of the first active patterns **150*a* may have an isolated shape extending in the third direction. The first active patterns 150*a* may be spaced apart from each other in the first and second directions. A first trench 140 may be positioned between the first active patterns 150*a*. In example embodiments, each of the first active patterns 150*a* may have a first line width (i.e., critical dimension), and a minimum width of the first trench 140** may be substantially equal to the first line width.

The first isolation pattern **170*a* may be formed in the first trench 140. The first isolation pattern 170*a* may include an inner wall oxide layer pattern 160*a* or the first isolation pattern 170*a* may include an inner wall oxide layer pattern 160*a* and a liner pattern 162*a*. In example embodiments, each of the inner wall oxide layer pattern 160*a* and the liner pattern 162*a* may include an insulation material formed by an atomic layer deposition (ALD) process. For example, the inner wall oxide layer pattern 160*a* may include or may be formed of silicon oxide, and the liner pattern 162*a*** may include or may be formed of silicon nitride.

The silicon dam structures **180*a* and 180*b* may be disposed in at least one of the first boundary region and the second boundary region. In example embodiments, the silicon dam structures 180*a* and 180*b* may be disposed in each of the first boundary region and the second boundary region. The silicon dam structure may include a first silicon dam structure 180*a* and a second silicon dam structure 180*b*. The first silicon dam structure 180*a* may be formed in the first boundary region, and a second silicon dam structure 180*b* may be formed in the second boundary region. The first silicon dam structure 180*a* and the second silicon dam structure 180*b*** may have different shapes to each other.

Hereinafter, it is described that the first and second silicon dam structures **180*a* and 180*b* may be formed in the first and second boundary regions, respectively, but in some example embodiments, the first and second silicon dam structures 180*a* and 180*b*** may be formed in only one of first and second boundary regions.

The first silicon dam structure **180*a* may extend in the second direction within the first boundary region. The first silicon dam structure 180*a* may include a first silicon dam pattern 182*a* and a first dam isolation pattern 182*b*. The first silicon dam pattern 182*a* may include first trench lines extending in the third direction. That is, the first silicon dam pattern 182*a* may include a silicon pattern having a line shape extending in the second direction, and at least a portion of the silicon pattern may have an etched shape in the third direction. Accordingly, the first trench lines extending in the third direction may be formed at the silicon pattern. The first trench lines may be regularly disposed at the silicon pattern. The first dam isolation pattern 182***b* may fill the first trench lines. The first trench lines may extend in a direction the same as an extension direction of the first active pattern 150*a*. An inner width of each of the first trench lines may be substantially the same as the first line width. As used herein, the term "at the silicon pattern" may refer to above the silicon pattern or within the silicon pattern.

In example embodiments, in the first silicon dam pattern 182*a*, the first trench line may partially cut (e.g., extend through or overlap) the first silicon dam pattern 182*a*. In this case, the first trench line may be formed at an edge portion of the first silicon dam pattern 182*a* opposite to (i.e., adjacent to) the memory cell region A. Accordingly, the first silicon dam pattern 182*a* may extend in the second direction, and the first trench line extending in the third direction may be disposed at the edge portion of the first silicon dam pattern 182*a* opposite (e.g., adjacent) to the memory cell region A.

In example embodiments, the first silicon dam structure 180*a* may be positioned closer to the first peripheral circuit region within the first boundary region. That is, a distance from the first silicon dam structure 180*a* to the memory cell region A may be greater than a distance from the first silicon dam structure 180*a* to the first peripheral circuit region.

A word line contact (not shown) being electrically connected to word lines in the memory cell region A may be formed on an edge portion of the memory cell region A and the first boundary region. The first silicon dam structure 180*a* may be positioned closer to the first peripheral circuit region, so that an area for forming the word line contact may be sufficiently secured.

In example embodiments, the first dam isolation pattern 182*b* may include only the inner wall oxide layer pattern 160*a*. The first dam isolation pattern 182*b* does not include a filling insulation pattern. For example, the first dam isolation pattern 182*b* does not include Tonen silazane (TOSZ) (e.g., a polysilazane).

The second silicon dam structure 180*b* may extend in the first direction within the second boundary region. The second silicon dam structure 180*b* may include a second silicon dam pattern 184*a* and a second dam isolation pattern 184*b*. The second silicon dam pattern 184*a* may include second trench lines extending in the third direction. That is, the second silicon dam pattern 184*a* may include a silicon pattern having a line shape extending in the second direction, and at least a portion of the silicon pattern may have an etched shape in the third direction. The silicon pattern may include the second trench lines extending in the third direction. The second trench lines may extend in a direction the same as an extension direction of the first active pattern 150*a*. An inner width of each of the second trench lines may be substantially the same as the first line width. In example embodiments, the second trench lines may have an arrangement density higher than an arrangement density of the first trench lines.

In example embodiments, in the second silicon dam structure 180*b*, the second trench line may completely cut (e.g., extend through or overlap) the silicon pattern in the third direction. The second silicon dam pattern 184*a* may include a plurality of lines and trench lines extending in the third direction, and the lines and trench lines may be arranged in the first direction.

In example embodiments, the second silicon dam structure 180*b* may be positioned closer to the memory cell region A in the second boundary region. That is, a distance from the second silicon dam structure 180*b* to the memory cell region A may be less than a distance from the second silicon dam structure 180*b* to the second peripheral circuit region.

As the second silicon dam structure 180*b* is positioned closer to the memory cell region A, a volume (i.e., amount) of the second isolation pattern 172*a* adjacent to the memory cell region A may be decreased. Accordingly, defects caused by the second isolation pattern 172*a* adjacent to the memory cell region A may be decreased.

In example embodiments, the second dam isolation pattern 184*b* may include only the inner wall oxide layer pattern 160*a*. The second dam isolation pattern 184*b* does not include the filling insulation pattern. For example, the second dam isolation pattern 184*b* does not include Tonen silazane (TOSZ).

In example embodiments, in a plan view, each of the first and second silicon dam pattern structures 180*a* and 180*b* may have a long bar shape. Ends of the first and second silicon dam pattern structures 180*a* and 180*b* may not be connected to each other, and may be spaced apart from each other.

The second isolation pattern 172*a* may be formed in the second trench 144. The second trench 144 may have a width greater than the width of the first trench 140. The second isolation pattern 172*a* may include the inner wall oxide layer pattern 160*a*, the liner pattern 162*a* and the filling insulation pattern 164*a*. The inner wall oxide layer pattern 160*a* and the liner pattern 162*a* may be conformally formed on an inner surface of the second trench 144. The filling insulation pattern 164*a* may mostly fill the second trench 144. The filling insulation pattern 164*a* may include or may be formed of silicon oxide having excellent gap filling characteristic, e.g., Tonen silazane (TOSZ).

When the filling insulation pattern 164*a* includes the TOSZ, a heat treatment process for densifying the TOSZ may be performed to form the silicon oxide. A volume of the TOSZ may be decreased by the heat treatment process, so that stress may be generated in the substrate 100.

If the silicon dam structure is not formed in the boundary region, the second isolation pattern may be formed in an entire boundary region. Therefore, a width of the second isolation pattern may be increased. As the width of the second isolation pattern is increased, the filling insulation pattern 164*a* may have a wider width and the stress applied to the substrate may increase. Due to the stress, a defect in which the first active patterns are warped or bent at the edge portion of the memory cell region adjacent to the second isolation pattern may occur. Accordingly, defects of the memory cells formed at the edge portion of the memory cell region may occur.

As described above, when the silicon dam structures 180*a* and 180*b* are formed in the boundary region, the width of the second isolation pattern 172*a* may be small compared to the case in which the silicon dam structure is not formed in the boundary region. Accordingly, an area occupied by the second isolation pattern 172*a* in the boundary region may be decreased, and an amount (i.e., a volume) of the filling insulation pattern 164*a* formed in the boundary region may be decreased.

Accordingly, the stress generated by the filling insulation pattern 164*a* in the second isolation pattern 172*a* may be decreased. The defect in which the first active patterns 150*a* are warped or bent at the edge portion of the memory cell region A adjacent to the second isolation pattern 172*a* may be decreased, and thus defects of the memory cells formed at the edge portion of the memory cell region may be decreased.

When the filling insulation pattern 164*a* includes TOSZ, heat may remain in the filling insulation pattern 164*a*, after the heat treatment process of the TOSZ. In this case, an oxygen component and the heat remaining in the filling insulation pattern 164*a* may be diffused into a bit line structure in subsequent processes, so that polysilicon included in the bit line structure may be oxidized or melted. Therefore, a line width of the bit line structure may be decreased by the oxidation or melting.

As described above, when the silicon dam structures 180*a* and 180*b* are formed in the boundary region B, the width of the second isolation pattern 172*a* may be small compared to the case in which the silicon dam structure is not formed in the boundary region. As the amount of the filling insulation pattern 164*a* in the second isolation pattern 172*a* may be decreased, defects caused by the heat remaining in the filling insulation pattern 164*a* may be decreased.

Actual circuits capable of operation may not be formed on the silicon dam structures 180*a* and 180*b*. The silicon dam structures 180*a* and 180*b* may not serve as substantial active regions. Accordingly, in example embodiments, contact plugs may not be formed on the silicon dam structures 180*a* and 180*b*. As a result, the silicon dam structures 180*a* and 180*b* may be referred to as "dummy structures."

The second active pattern 180*c* and the third isolation pattern 170*c* may have various shapes according to peripheral circuits formed on the peripheral circuit region.

Although not shown, various circuit patterns for forming the semiconductor device may be formed on the second active patterns.

The shape and size of the silicon dam structure in the boundary region B may be varied as discussed below.

Hereinafter, example embodiments of the semiconductor device including the silicon dam structure in the boundary region may be described. The semiconductor device illustrated below may be the same as the semiconductor device illustrated with reference to FIGS. 1 to 3, except for the silicon dam structure. Therefore, a shape of the silicon dam structure may be mainly described.

Figure 4:
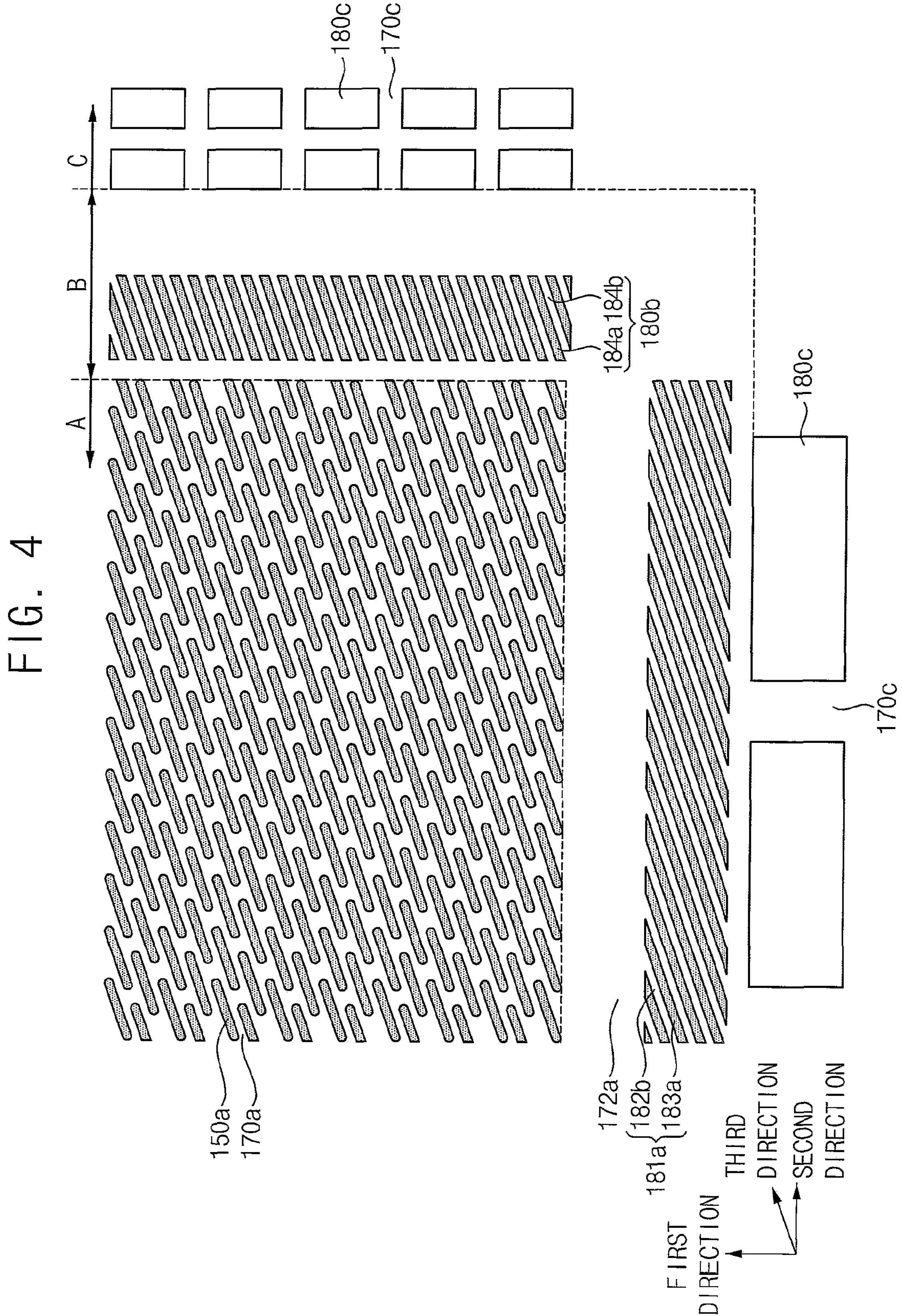
Figure 5:
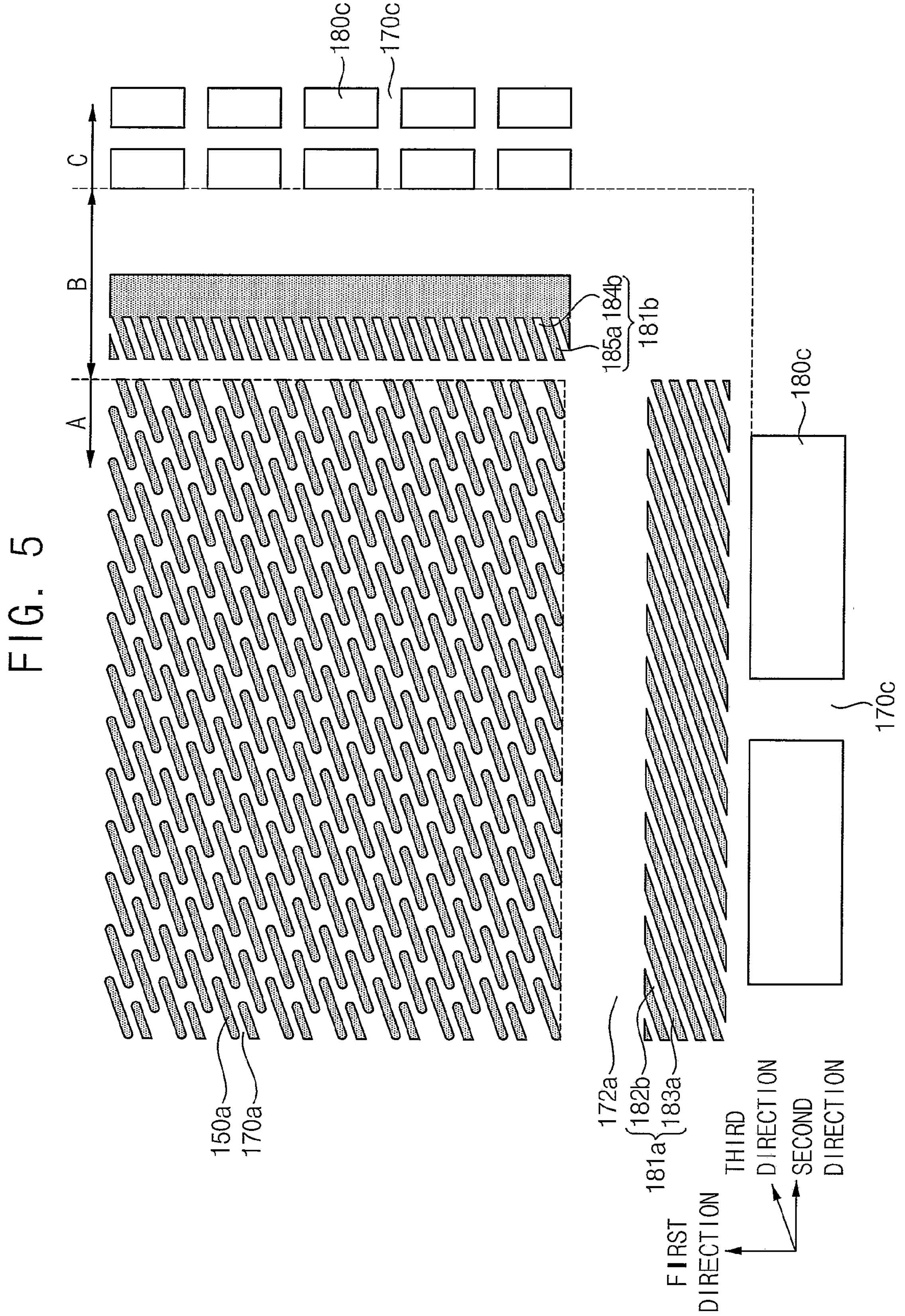
Figure 6:
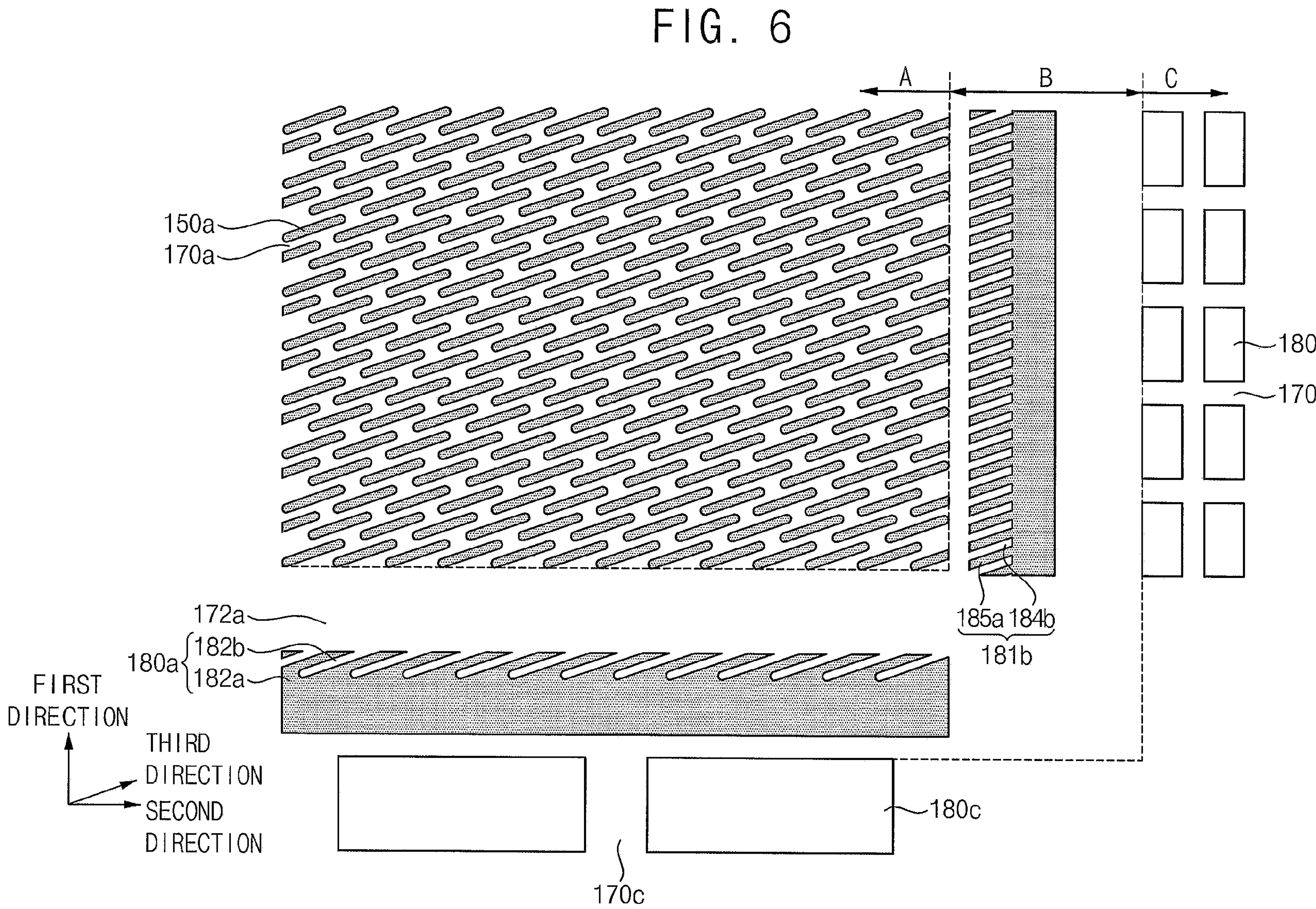

FIGS. 4 to 6 are plan views illustrating semiconductor devices in accordance with example embodiments, respectively.

Referring to FIG. 4, in the first silicon dam pattern 183*a* included in the first silicon dam structure 181*a*, the silicon pattern may be completely cut by the first trench lines. Accordingly, the first silicon dam pattern 183*a* may include a plurality of lines extending in the third direction, and the lines may be arranged in the second direction. The second silicon dam structure 180*b* may be substantially the same as the second silicon dam structure described with reference to FIGS. 1 to 3.

Referring to FIG. 5, in the first silicon dam pattern 183*a* included in the first silicon dam structure 181*a*, the silicon pattern may be completely cut by the first trench lines. That is, the first silicon dam structure 181*a* may be substantially the same as the first silicon dam structure shown in FIG. 4.

In the second silicon dam pattern 185*a* included in the second silicon dam structure 181*b*, the silicon pattern may be partially cut by second trench lines. In this case, the second trench lines may be formed at an edge portion of the second silicon dam pattern 185*a* opposite to the memory cell region A. Accordingly, the second silicon dam pattern 185*a* may have a line shape extending in the first direction, and second trench lines extending in the third direction may be disposed at the edge portion of the second silicon dam pattern 185*a* opposite (e.g., adjacent) to the memory cell region A.

Referring to FIG. 6, the first silicon dam structure 180*a* may be substantially the same as the first silicon dam structure described with reference to FIGS. 1 to 3.

In the second silicon dam pattern 185*a* included in the second silicon dam structure 181*b*, the silicon pattern may be partially cut by second trench lines. That is, the second silicon dam structure 181*b* be substantially the same as the second silicon dam structure illustrated in FIG. 5.

FIGS. 7 to 10 are plan views illustrating semiconductor devices in accordance with example embodiments, respectively.

Figure 7:
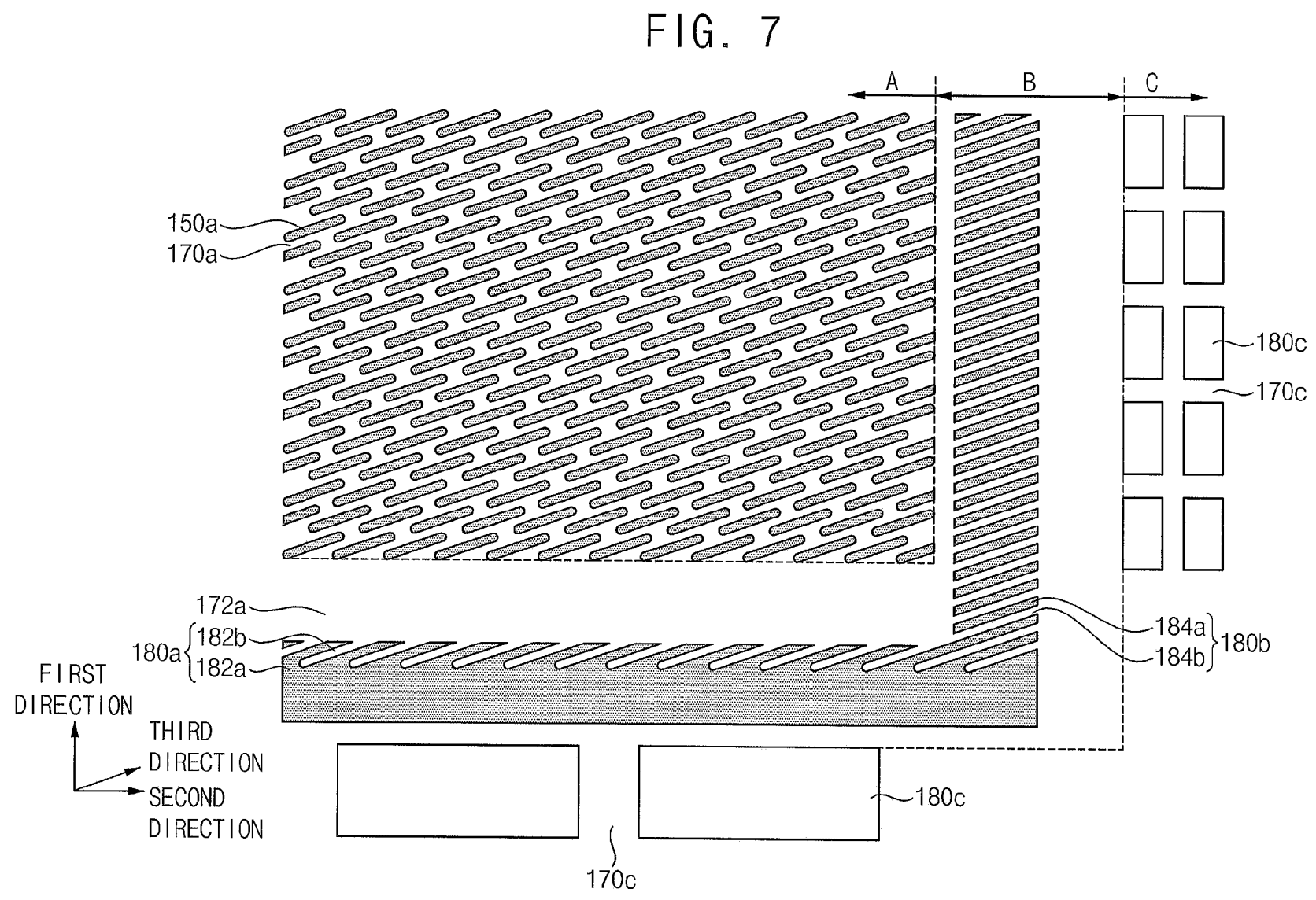

Referring to FIG. 7, the semiconductor device may include the first silicon dam structure 180*a* and the second silicon dam structure 180*b* having substantially the same shape as those described with reference to FIG. 1, respectively. However, ends of the first and second silicon dam structures 180*a* and 180*b* may be connected to each other. Accordingly, the first and second silicon dam pattern structures 180*a* and 180*b* may have a shape of a rectangular frame (i.e., a rectangular ring) that surrounds the memory cell region A.

Figure 8:
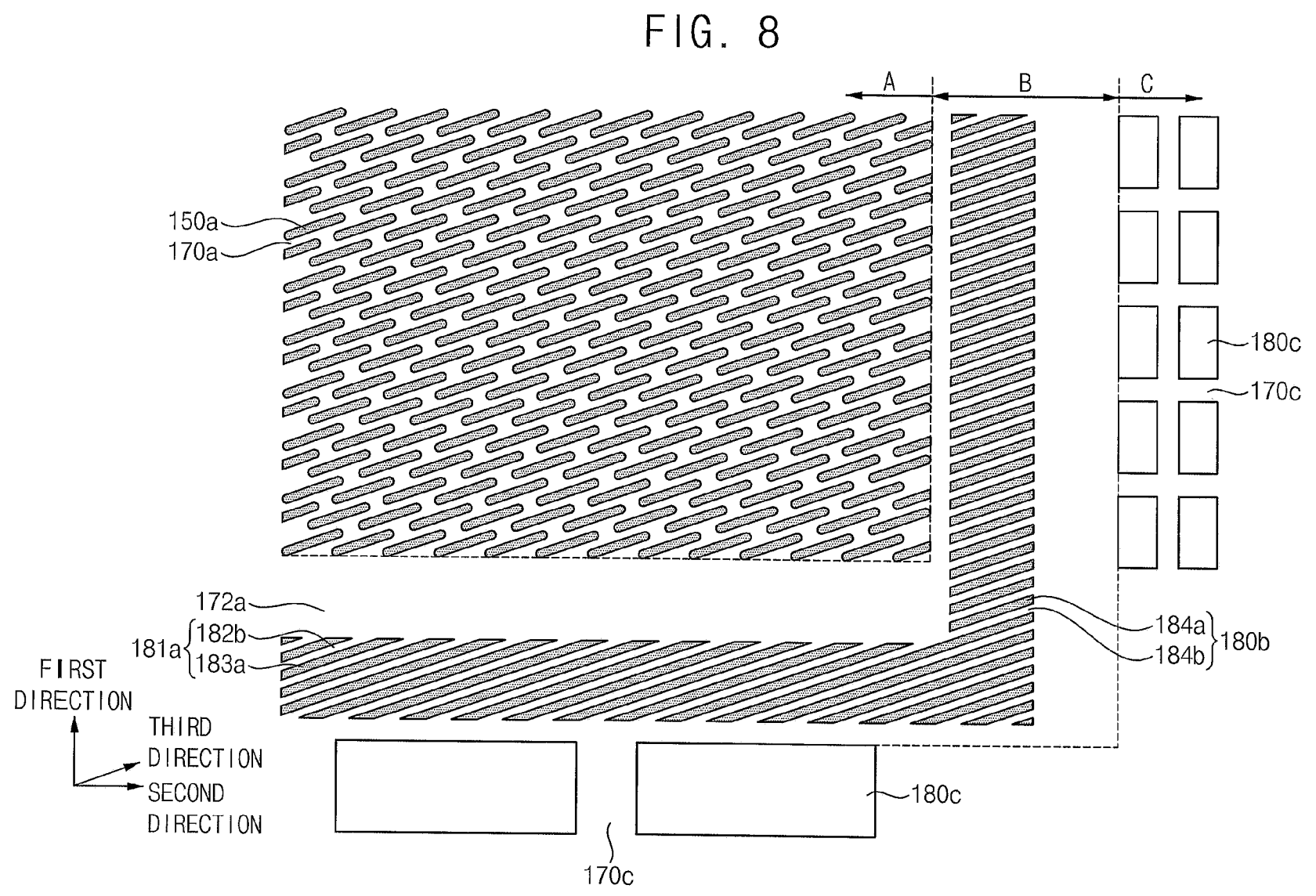

Referring to FIG. 8, the semiconductor device may include the first silicon dam structure 181*a* and the second silicon dam structure 180*b* having substantially the same shape as those described with reference to FIG. 4, respectively. However, ends of the first and second silicon dam structures 181*a* and 180*b* may be connected to each other. Accordingly, the first and second silicon dam pattern structures 181*a* and 180*b* may also have a rectangular frame shape.

Figure 9:
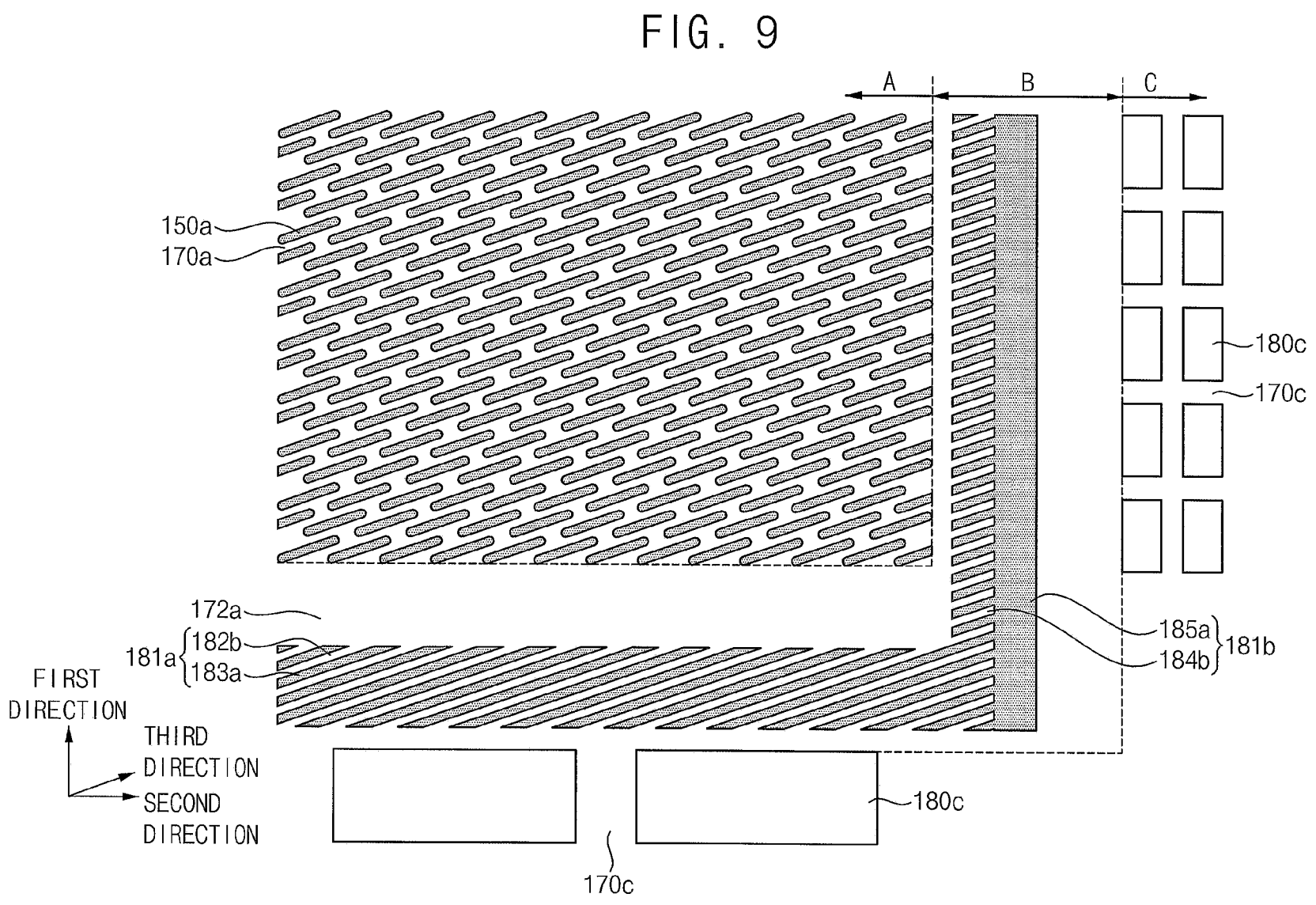

Referring to FIG. 9, the semiconductor device may include the first silicon dam structure 181*a* and a second silicon dam structure 181*b* having substantially the same shape as those described with reference to FIG. 5, respectively. However, ends of the first and second silicon dam structures 181*a* and 181*b* may be connected to each other. Accordingly, the first and second silicon dam pattern structures 181*a* and 181*b* may also have a rectangular frame shape.

Figure 10:
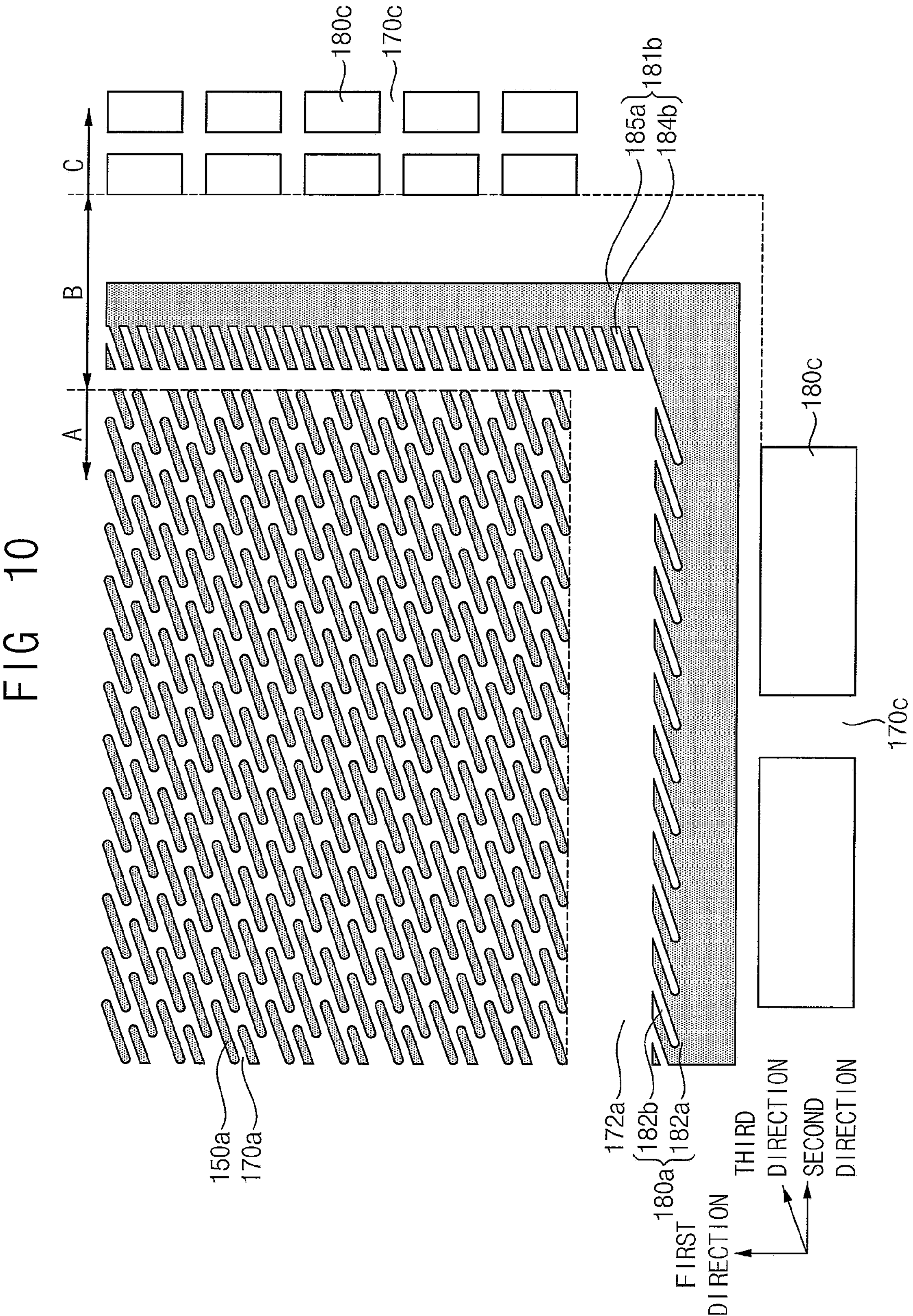

Referring to FIG. 10, the semiconductor device may include the first silicon dam structure 180*a* and the second silicon dam structure 181*b* having substantially the same shape as those described with reference to FIG. 6, respectively. However, ends of the first and second silicon dam structures 180*a* and 181*b* may be connected to each other. Accordingly, the first and second silicon dam pattern structures 180*a* and 181*b* may also have a rectangular frame shape.

Figure 11:
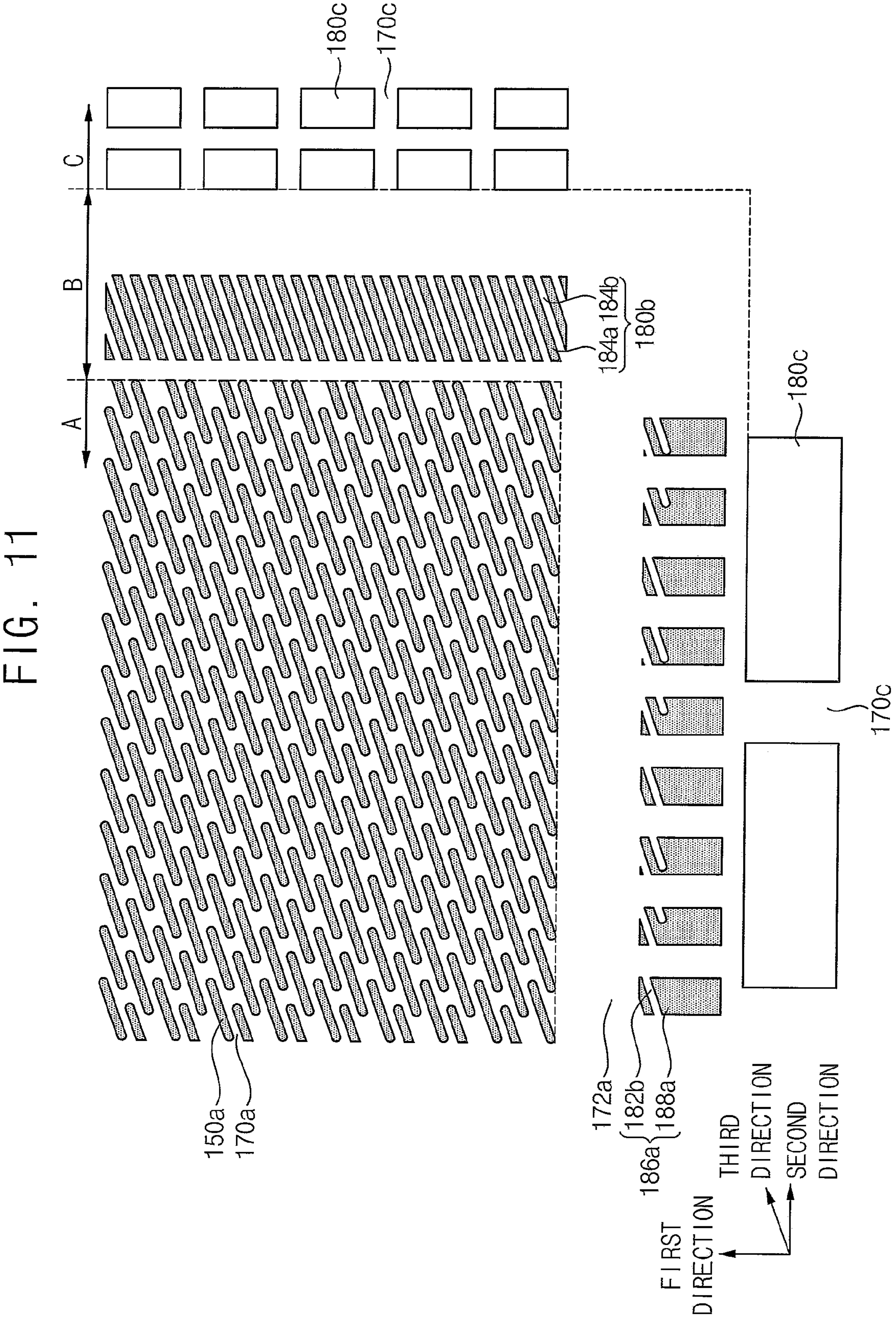
Figure 12:
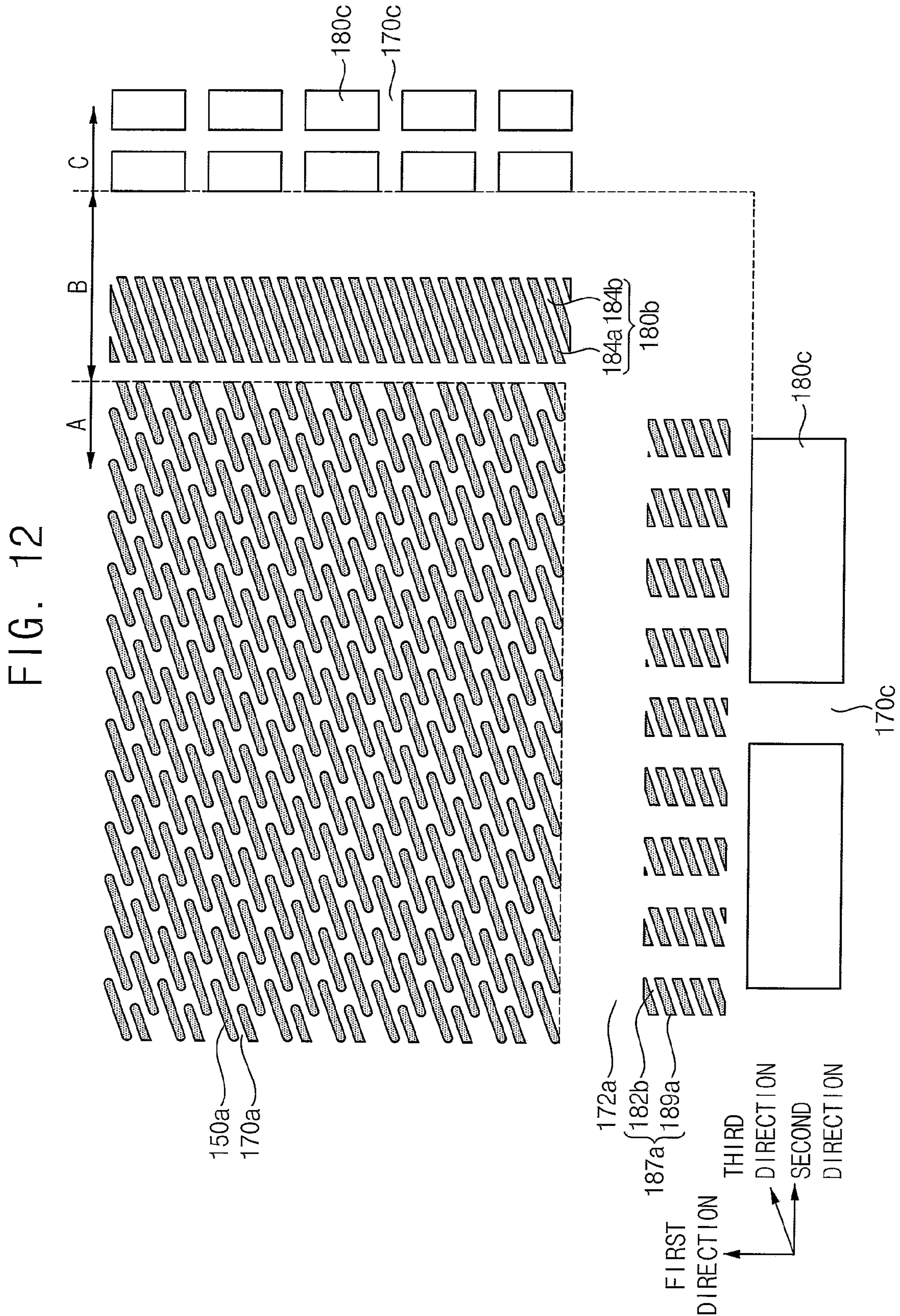

FIGS. 11 and 12 are plan views of semiconductor devices in accordance with example embodiments, respectively.

Referring to FIG. 11, the first silicon dam structure 186*a* may be formed in a region extending in the second direction within the first boundary region. The first silicon dam structure 186*a* may include a plurality of first silicon dam patterns 188*a* and a first dam isolation pattern 182*b*. The first silicon dam patterns 188*a* may be arranged in the second direction, and may be spaced apart from each other in the second direction. At least a portion of each of the first silicon dam patterns 188*a* may include the first trench lines extending in the third direction. The first dam isolation pattern 182*b* may be formed in the first trench lines.

The second silicon dam structure 180*b* may be substantially the same as the second silicon dam structure described with reference to FIG. 1. Alternatively, the second silicon dam structure may be substantially the same as the second silicon dam structure described with reference to FIG. 5.

In example embodiments, as shown in FIG. 11, the first trench lines may be formed only at an edge portion of the first silicon dam pattern 186*a* opposite (e.g., adjacent) to the memory cell region. Ends of the first and second silicon dam structures 186*a* and 180*b* may be spaced apart from each other.

In example embodiments, as shown in FIG. 12, the first trench lines may be disposed along the entirety of each of the first silicon dam patterns 189*a*. Accordingly, the first silicon dam pattern 189*a* may include a plurality of lines extending in the third direction.

Ends of the first and second silicon dam structures 187*a* and 180*b* may be spaced apart from each other.

Figure 13:
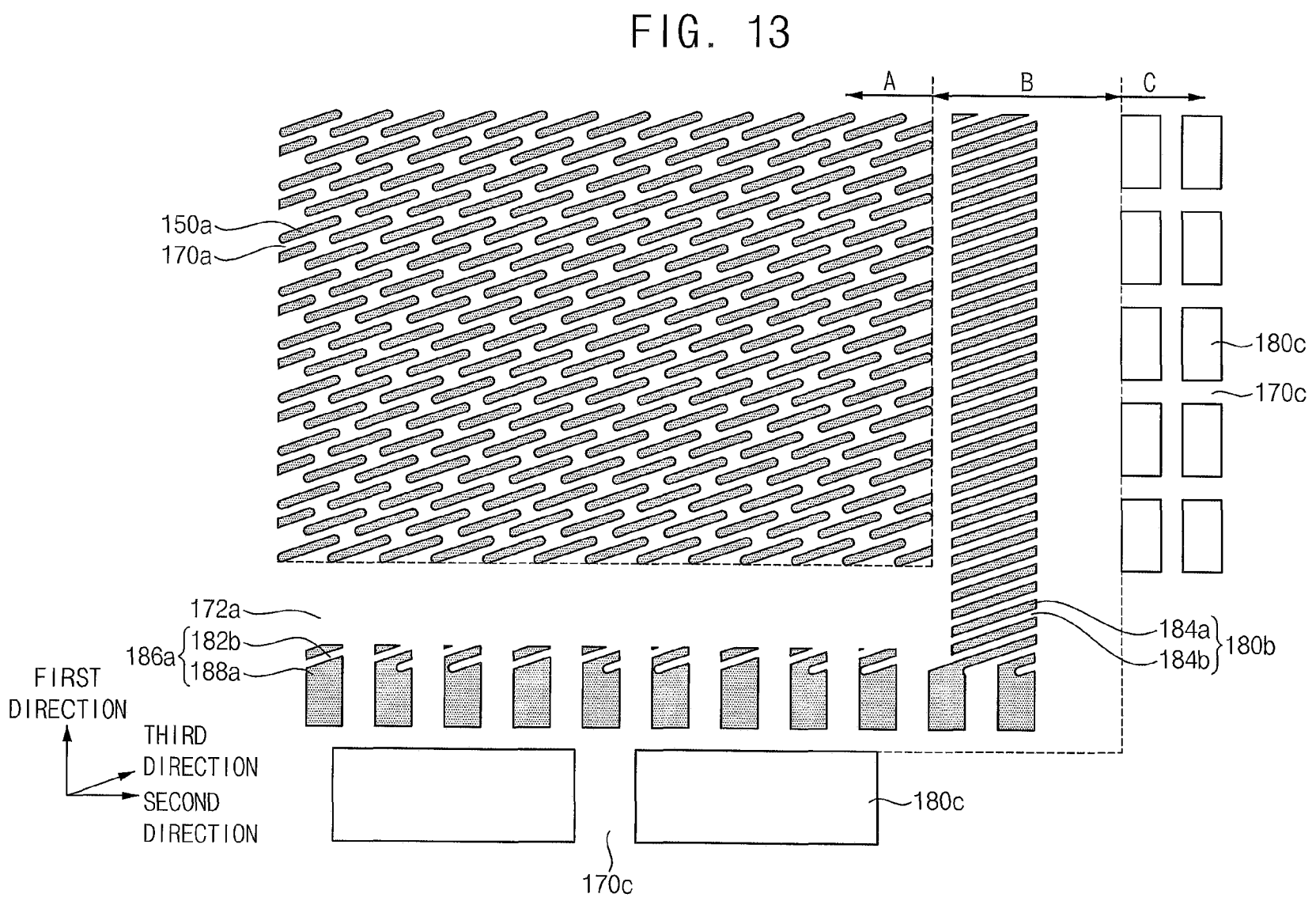
Figure 14:
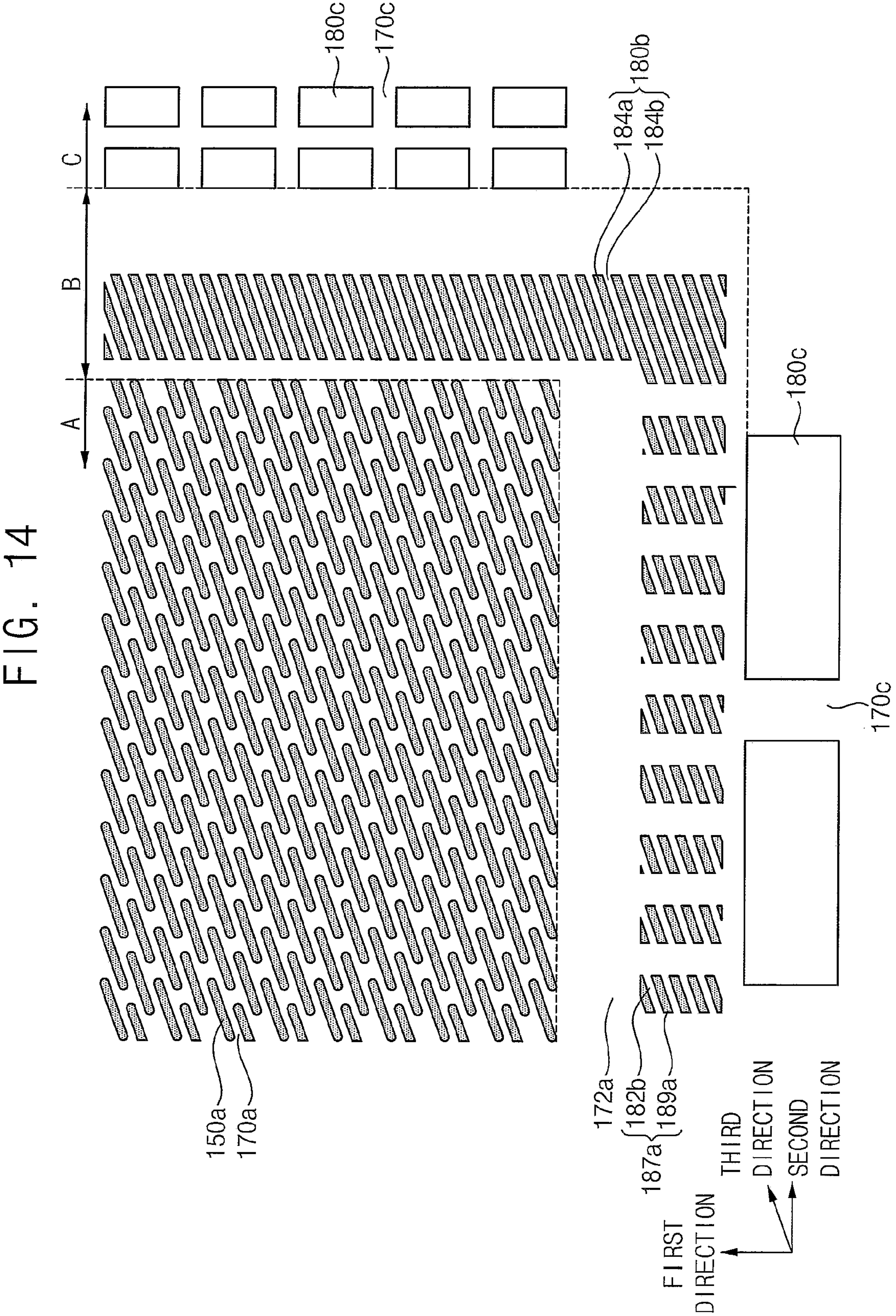

FIGS. 13 and 14 are plan views of semiconductor devices in accordance with example embodiments, respectively.

Referring to FIG. 13, the semiconductor device may include the first silicon dam structure 186*a* and the second silicon dam structure 180*b* having substantially the same shape as those described with reference to FIG. 11, respectively. However, ends of the first and second silicon dam structures 186*a* and 180*b* may be connected to each other. Accordingly, the first and second silicon dam pattern structures 186*a* and 180*b* may have a rectangular frame shape.

Referring to FIG. 14, the semiconductor device may include the first silicon dam structure 187*a* and the second silicon dam structure 180*b* having substantially the same shape as those described with reference to FIG. 12, respectively. However, ends of the first and second silicon dam structures 187*a* and 180*b* may be connected to each other. Accordingly, the first and second silicon dam pattern structures 187*a* and 180*b* may have a rectangular frame shape.

FIGS. 15 to 31 are cross-sectional views and plan views illustrating a method of forming active patterns in a semiconductor device in accordance with example embodiments.

In order to avoid complication of the drawings, only an edge portion of the memory cell region and the first boundary region are illustrated in each of the cross-sectional views, and the peripheral circuit region is not illustrated. FIGS. 15 to 24, 26 to 28, 30 and 31 are cross-sectional views taken along line I-I' of FIG. 1.

Figure 15:
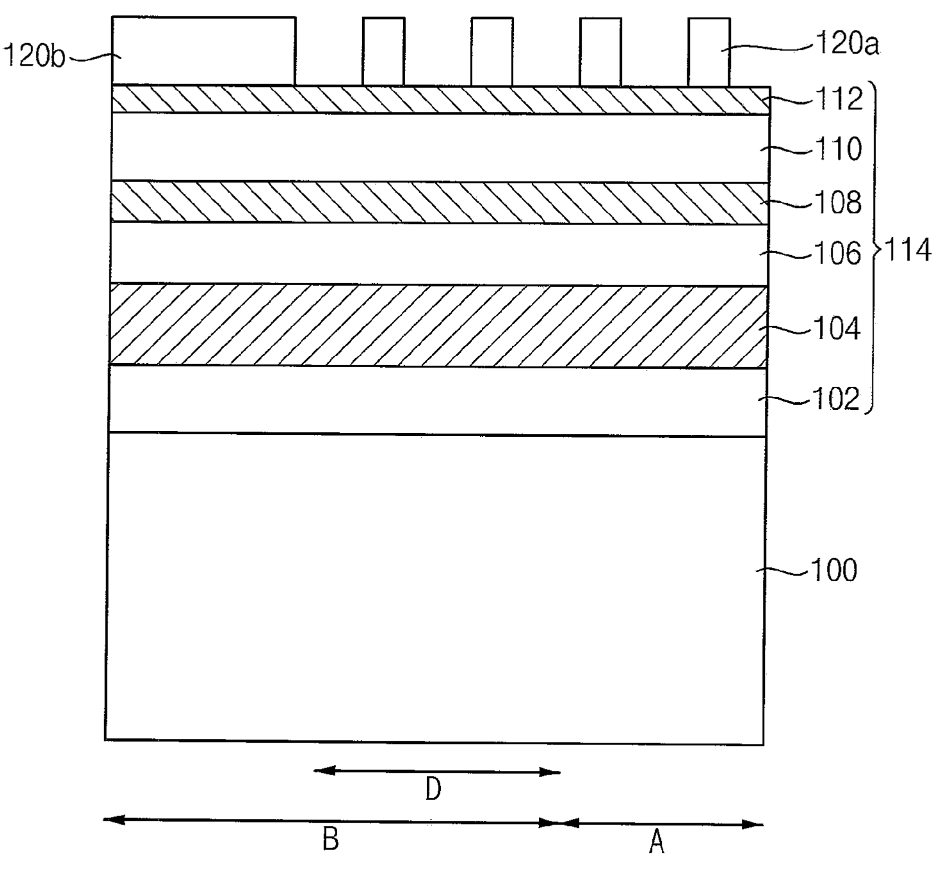

Referring to FIG. 15, a mask layer structure 114 serving as a mask for forming a trench may be formed on a substrate 100. The mask layer structure 114 may have a structure in which a plurality of layers are stacked.

The substrate 100 may include a single crystal semiconductor material. The substrate 100 may include or may be formed of a semiconductor material such as silicon, germanium, or silicon-germanium. In example embodiments, the substrate 100 may include single crystal silicon.

In example embodiments, the mask layer structure 114 may include a first silicon oxide layer 102, a polysilicon layer 104, an amorphous carbon layer 106, a first silicon oxynitride layer 108, a first spin-on hard mask 110 and a second silicon oxynitride layer 112. However, the layers included in the mask layer structure 114 may not be limited thereto. Upper and lower adjacent layers included in the mask layer structure 114 may have a high etching selectivity to each other.

Hereinafter, a method for forming the active patterns by a quadruple patterning technique (QPT) process is described. However, the method for forming the active patterns may be not limited thereto. For example, the method for forming the active patterns may be a double patterning technique (DPT) process.

Photoresist patterns 120*a* and 120*b* are formed on the mask layer structure 114.

A first photoresist pattern 120*a* may be formed in a memory cell region A and a first region D. The first region D may be a region for forming the first and second trench lines of the first and second silicon dam structures in the boundary region B. The first region D may extend from an edge portion of the memory cell region A and partially through the boundary region B. The first photoresist pattern 120*a* may include lines extending in the third direction, and the lines may be repeatedly disposed on the mask layer structure 114. Each line of the first photoresist pattern 120*a* may be formed in the memory cell region A, and may extend to the first region D of the boundary region from the memory cell region A. That is, each line of the first photoresist pattern 120*a* may be disposed at the first region D of the boundary region B and the memory cell region A.

The first photoresist pattern 120*a* may have a line width of about three times the first line width that may be a target line width of a first active pattern. Further, a gap between the first photoresist patterns may have a line width of about 5 times the first line width.

A second photoresist pattern 120*b* may be formed on the peripheral circuit region C (not illustrated in FIG. 15) and a portion of the boundary region B. For example, the second photoresist pattern 120*b* may be formed on the boundary region B except for the first region D, such that the second photoresist pattern 120*b* covers the peripheral circuit region C and the boundary region B excluding the first region D.

Figure 16:
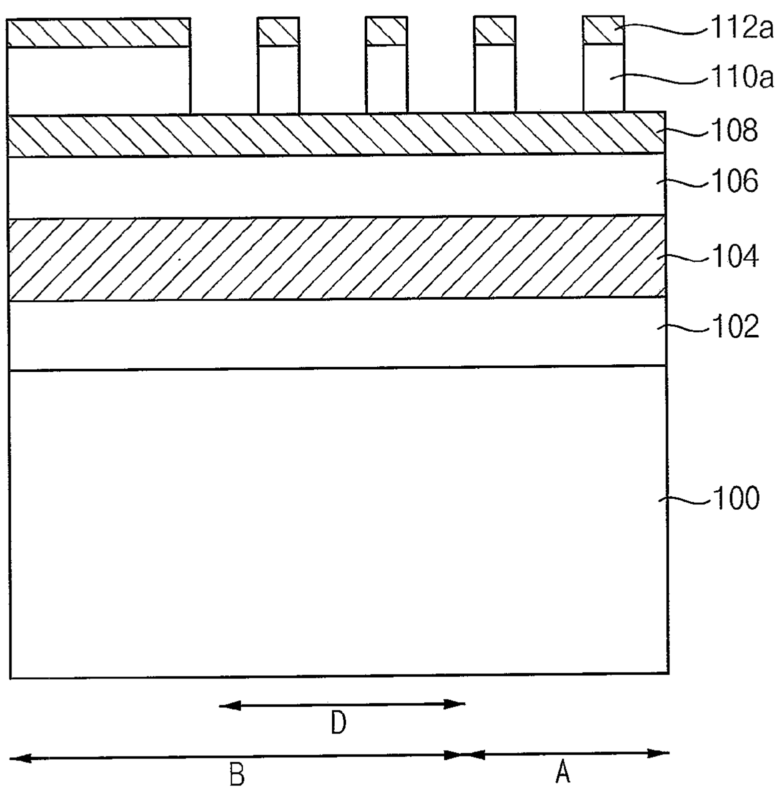

Referring to FIG. 16, the second silicon oxynitride layer 112 and the first spin-on hard mask layer 110 may be sequentially etched using the first and second photoresist patterns 120*a* and 120*b* as etch masks. Accordingly, a first spin-on hard mask pattern 110*a* and a second silicon oxynitride layer pattern 112*a* may be formed on the first silicon oxynitride layer 108.

Figure 17:
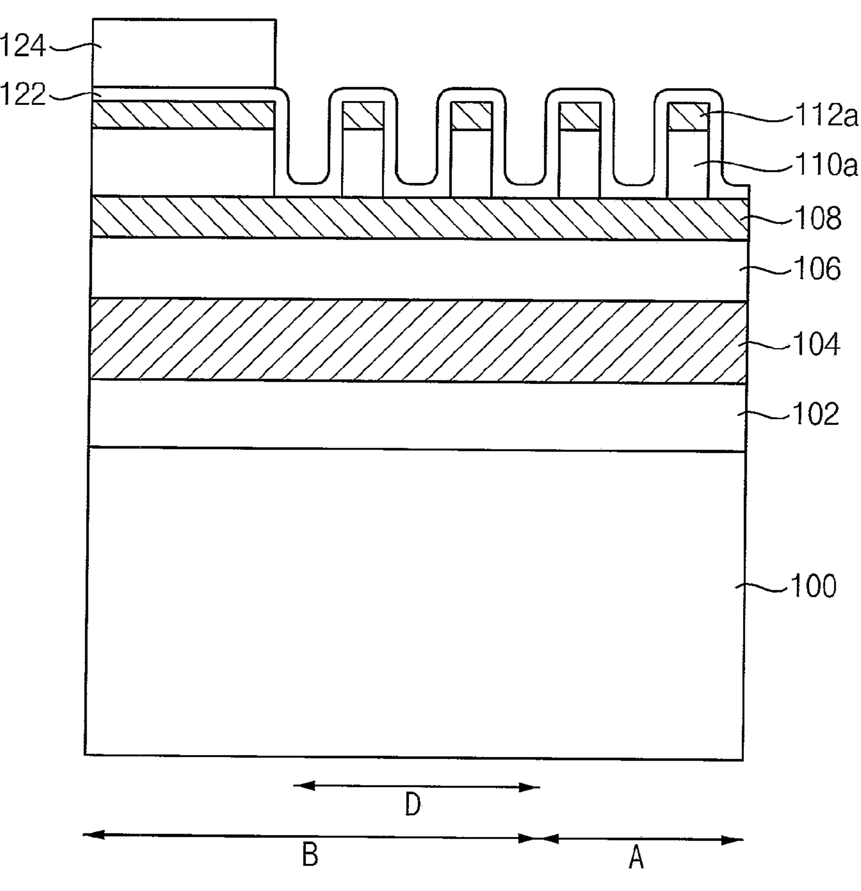

Referring to FIG. 17, a second silicon oxide layer 122 may be conformally formed on the first spin-on hard mask pattern 110*a*, the second silicon oxynitride layer pattern 112*a* and the first silicon oxynitride layer 108. The second silicon oxide layer 122 may be formed to have substantially the same thickness as the first line width.

A third photoresist pattern 124 may be formed on the second silicon oxide layer 122. The third photoresist pattern 124 may selectively expose (e.g., not cover) the memory cell region A and the first region D.

Figure 18:
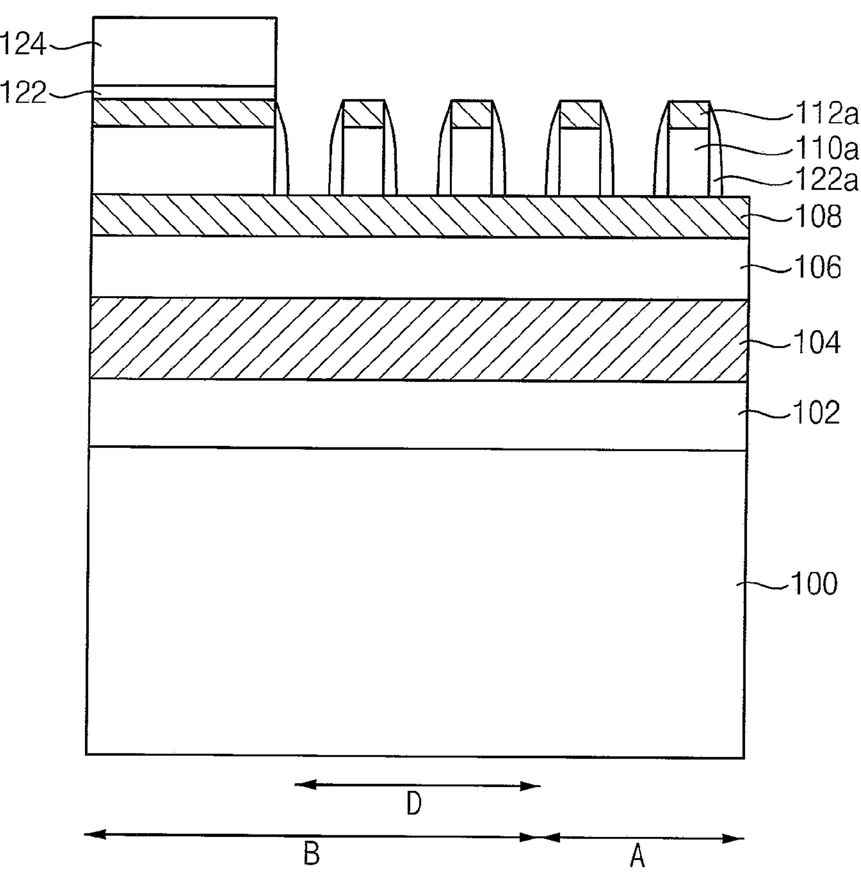

Referring to FIG. 18, the second silicon oxide layer 122 may be anisotropically etched to form a first spacer pattern 122*a* on sidewalls of the first spin-on hard mask pattern 110*a* and the second silicon oxynitride layer pattern 112*a* in the cell memory region A and the first region D.

Figure 19:
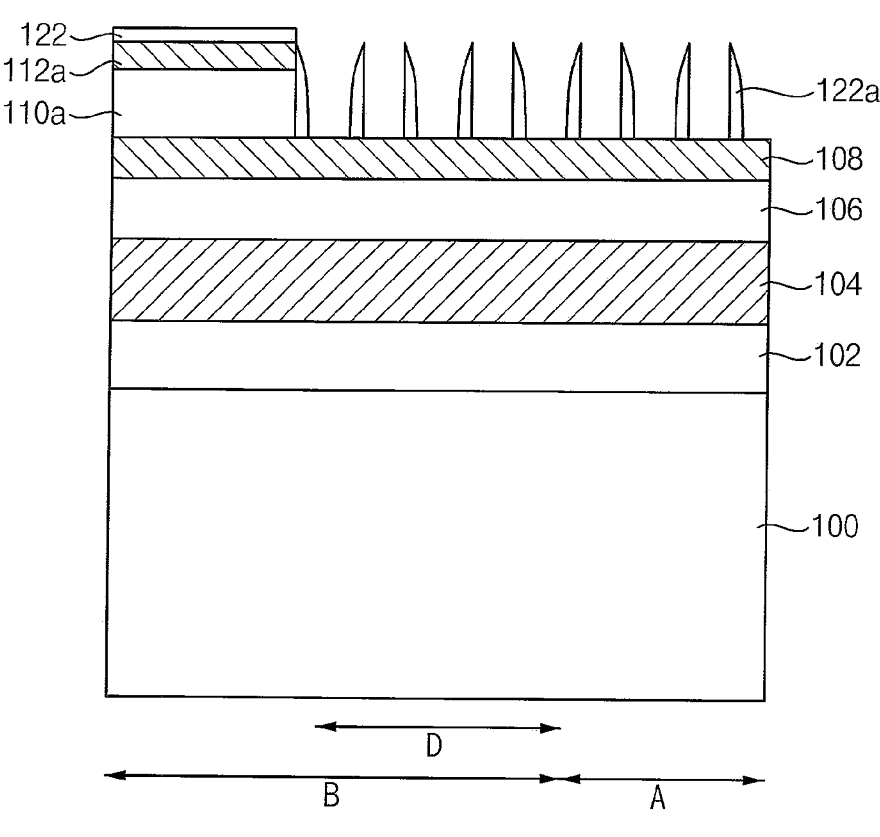

Referring to FIG. 19, the second silicon oxynitride layer pattern 112*a* and the first spin-on hard mask pattern 110*a* between the first spacer patterns 122*a* may be sequentially etched to form a space between the first spacer patterns 122*a*.

The second silicon oxynitride layer pattern 112*a* and the first spin-on hard mask pattern 110*a* in the memory cell region A and the first region D may be completely removed by the etching process. The first spacer patterns 122*a* may remain on the first silicon oxynitride layer 108. In a remaining region (hereinafter, referred to as a second region) except for the memory cell region A and the first region D, the third photoresist pattern 124 may be removed by an etching process. Accordingly, the first spin-on hard mask pattern 110*a*, the second silicon oxynitride layer pattern 112*a* and the second silicon oxide layer 122 may remain on the first silicon oxynitride layer 108 in the second region, after performing the etching process.

Figure 20:
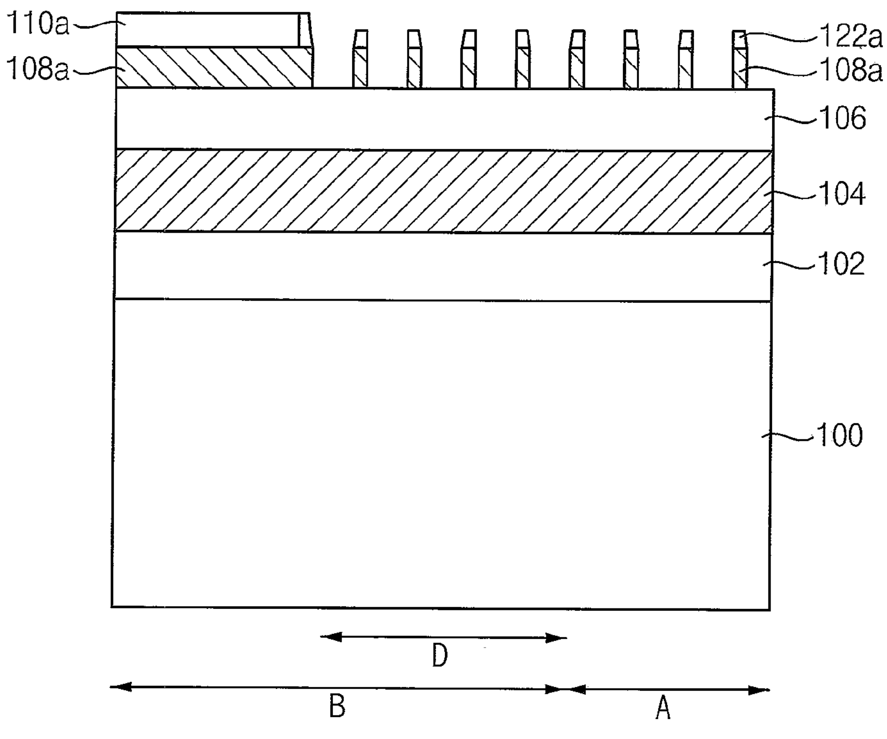

Referring to FIG. 20, exposed first silicon oxynitride layer 108 between the first spacer patterns 122*a* may be anisotropically etched. Therefore, the first silicon oxynitride layer 108 in the memory cell region A and the first region D may be etched to form a first silicon oxynitride layer pattern 108*a*.

The amorphous carbon layer 106 may be exposed between the first silicon oxynitride layer patterns 108*a*. In the etching process, the second silicon oxide layer 122 and the second silicon oxynitride layer 112*a* in the second region may be removed together, and thus the first spin-on hard mask pattern 110*a* in the second region may be exposed.

Figure 21:
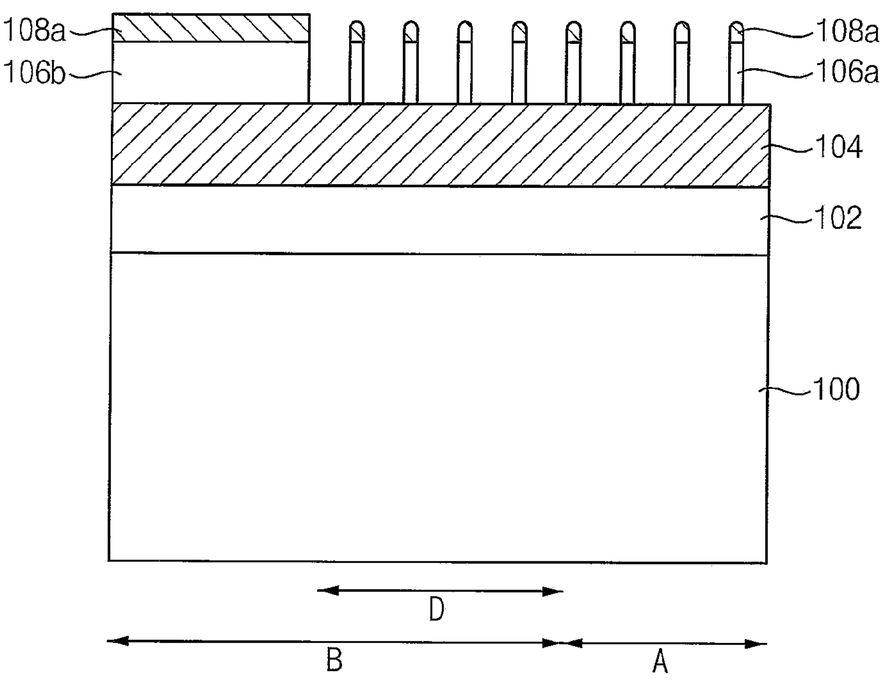

Referring to FIG. 21, exposed amorphous carbon layer 106 between the first silicon oxynitride layer patterns 108*a* may be anisotropically etched. Therefore, the amorphous carbon layer 106 in the memory cell region A and the first region D may be etched to form a first amorphous carbon pattern 106*a*.

By performing the etching process for forming the first amorphous carbon pattern 106*a*, the first spacer pattern 122*a* and the first spin-on hard mask pattern 110*a* may be completely removed, and at least portion of the first silicon oxynitride layer pattern 108*a* may be etched.

Accordingly, the first amorphous carbon pattern 106*a* may be formed in the memory cell region A and the first region D, and the first silicon oxynitride layer pattern 108*a* may remain on the first amorphous carbon pattern 106*a* to have a reduced thickness. The polysilicon layer 104 may be exposed between the first amorphous carbon patterns 106*a* in the memory cell region A and the first region D.

A second amorphous carbon pattern 106*b* and the first silicon oxynitride layer pattern 108*a* may be formed in the second region to cover the second region. A thickness of the first silicon oxynitride layer pattern 108*a* in the second region may be greater than the thickness of the first silicon oxynitride layer pattern 108*a* in the memory cell regions A and the first region D.

Figure 22:
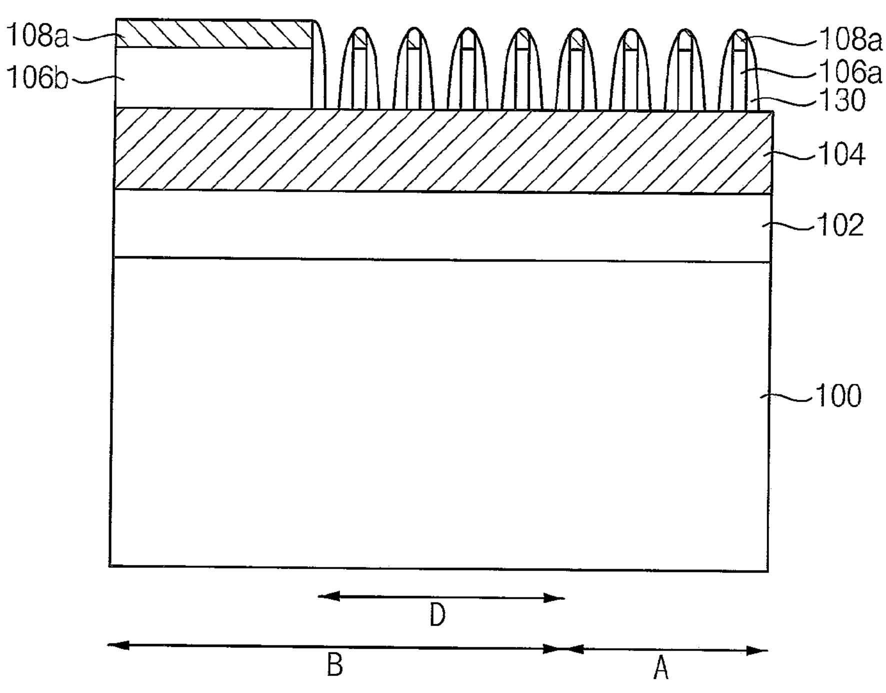

Referring to FIG. 22, a third silicon oxide layer may be conformally formed on the first silicon oxynitride layer pattern 108*a*, the second amorphous carbon pattern 106*b*, the first amorphous carbon pattern 106*a* and the polysilicon layer 104. The third silicon oxide layer may be formed to have the same thickness as the first line width.

The third silicon oxide layer may be anisotropically etched to form a second spacer pattern 130 on sidewalls of the first amorphous carbon pattern 106*a* and the second amorphous carbon pattern 106*b*.

Figure 23:
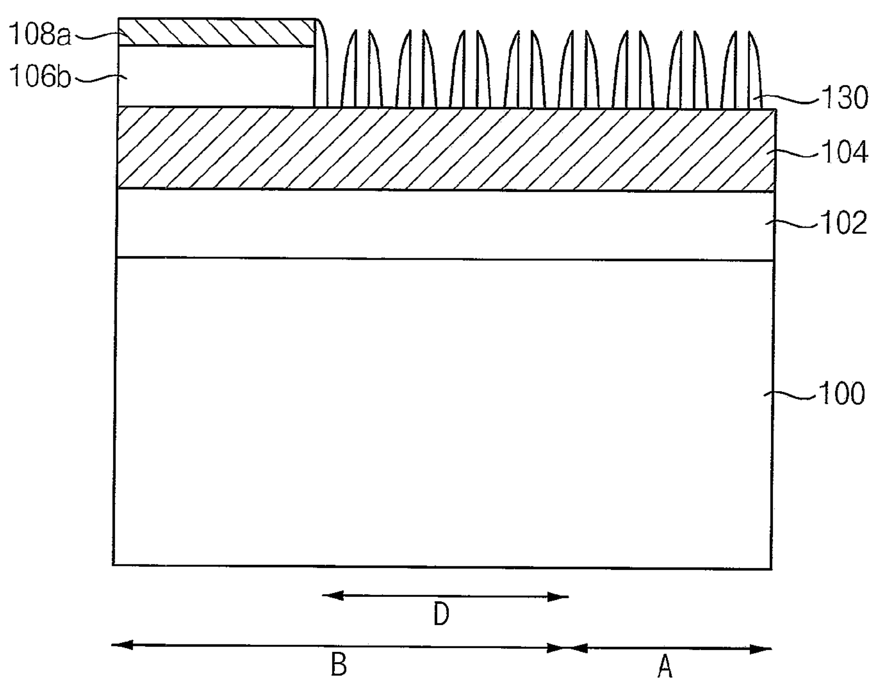

Referring to FIG. 23, the first silicon oxynitride layer pattern 108*a* in the memory cell region A and the first region D may be etched. In this case, the first silicon oxynitride layer pattern 108*a* in the second region may remain with a reduced thickness.

Thereafter, the first amorphous carbon pattern 106*a* in the memory cell region A and the first region D may be removed. Accordingly, the polysilicon layer 104 may be exposed between the second spacer patterns 130. In this case, the first silicon oxynitride layer pattern 108*a* may remain in the second region, so that the second amorphous carbon pattern 106*b* may not be removed in the second region.

The second spacer pattern 130 in the memory cell region A and the first region D may have a line shape extending in the third direction, and may have the first line width. The second spacer patterns 130 may be spaced apart from each other by the same distance as the first line width.

Figure 24:
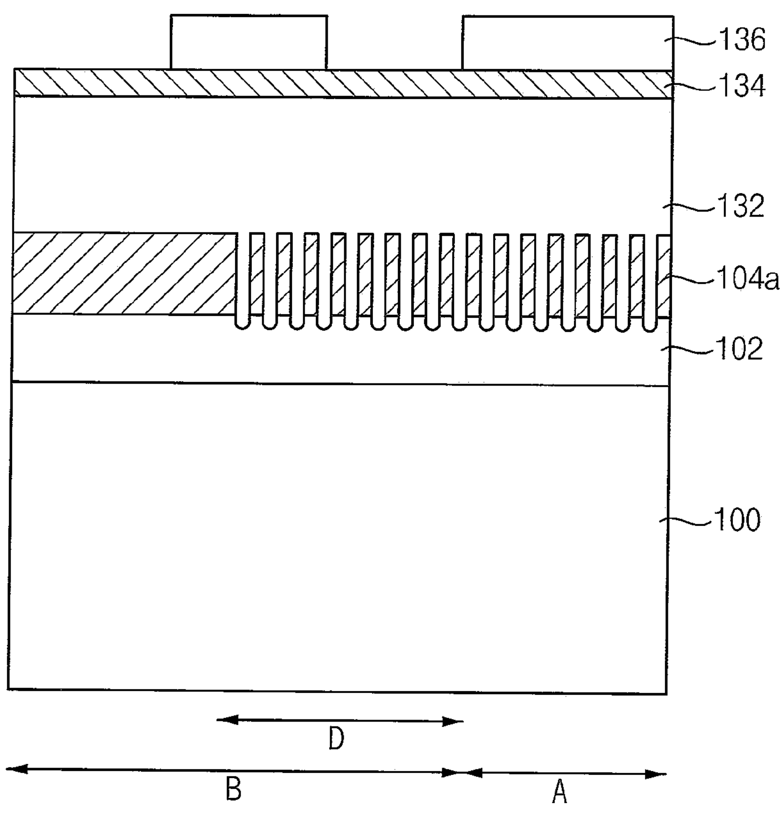
Figure 25:
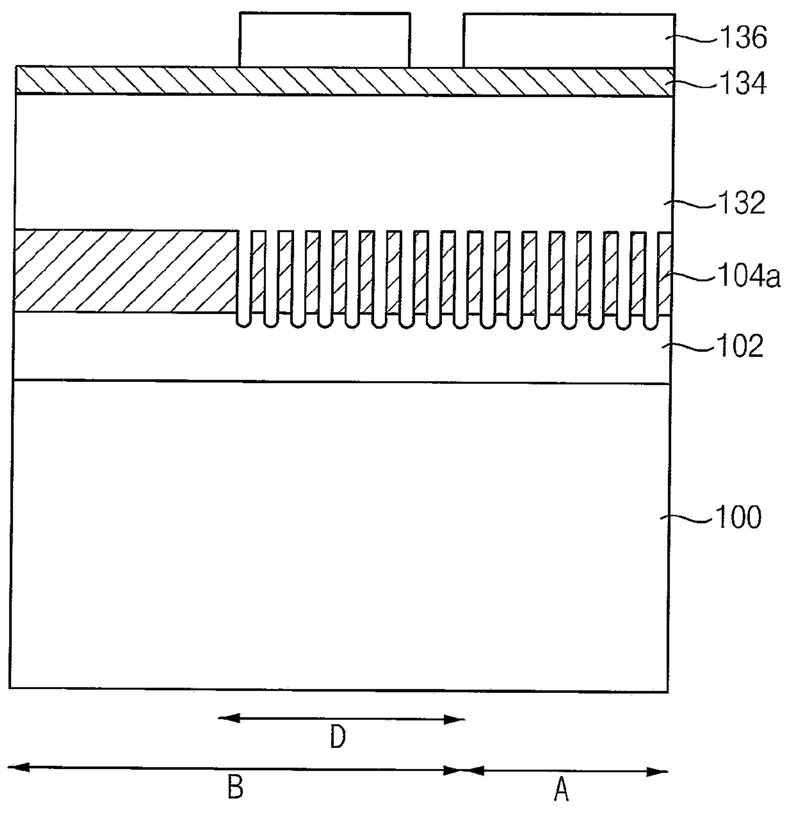

Referring to FIGS. 24 and 25, the polysilicon layer 104 exposed between the second spacer patterns 130 may be etched to form a first polysilicon pattern 104*a*.

The first polysilicon pattern 104*a* in the memory cell region A and the first region D may have a line shape extending in the third direction, and may have the first line width. The first polysilicon patterns 104*a* may be spaced apart from each other by the same distance as the first line width.

The second spacer patterns 130, first silicon oxynitride layer pattern 108*a*, and the second amorphous carbon pattern 106*b* may be removed by an etching process. An extension portion of the first polysilicon pattern 104*a* may remain in the second region and may cover the first silicon oxide layer 102 in the second region.

A second spin-on hard mask layer 132 may be formed to cover the first polysilicon pattern 104*a* in the memory cell region A and the first region D and cover the polysilicon layer 104 in the second region. A third silicon oxynitride layer 134 may be formed on the second spin-on hard mask layer 132. A fourth photoresist pattern 136 may be formed on the third silicon oxynitride layer 134.

Although not shown, the fourth photoresist pattern 136 formed in the memory cell region A may selectively expose a cutting portion of the first polysilicon pattern 104*a* for forming the first active pattern.

The fourth photoresist pattern 136 formed in the boundary region B may cover a region for forming the first and second silicon dam structures. Accordingly, the fourth photoresist pattern 136 formed in the boundary region B may selectively expose a portion for forming the second isolation pattern.

The fourth photoresist pattern 136 formed in the boundary region B may cover at least a portion of a line-and-space portion of the first polysilicon pattern 104*a* in the first region D.

Although not shown, the fourth photoresist pattern 136 formed in the peripheral circuit region C may be formed to selectively expose a portion of the peripheral circuit region C for forming the third isolation pattern.

A portion exposed by the fourth photoresist pattern 136 in the boundary region B may be a region where a silicon dam structure is not formed by subsequent processes. A portion covered by the fourth photoresist pattern 136 in the boundary region B may be a region where the silicon dam structure is formed by the subsequent processes. Therefore, a position and a shape of the silicon dam structure formed by the subsequent processes may be changed according to a position of the fourth photoresist pattern 136 in the boundary region B.

For example, as shown in FIG. 24, the fourth photoresist pattern 136 in the boundary region B may cover a portion of the line-and-space portion of the first polysilicon pattern 104*a* and a portion of the extension portion of the first polysilicon pattern 104*a* adjacent to the line-and-space portion. In this case, the silicon dam structure formed by the subsequent processes may have the trench lines partially cutting the silicon dam pattern.

For example, as shown in FIG. 25, the fourth photoresist pattern 136 in the boundary region may cover only the line-and-space portion of the first polysilicon pattern 104*a*. In this case, the silicon dam structure formed by the subsequent processes may have the trench lines completely cutting the silicon dam pattern.

According to the shape of the silicon dam structure, the fourth photoresist pattern as shown in FIG. 24 or the fourth photoresist pattern as shown in FIG. 25 may be formed in each of the first boundary region and the second boundary region.

Hereinafter, the silicon dam structure having trench lines partially cutting the silicon dam pattern may be illustrated.

Figure 26:
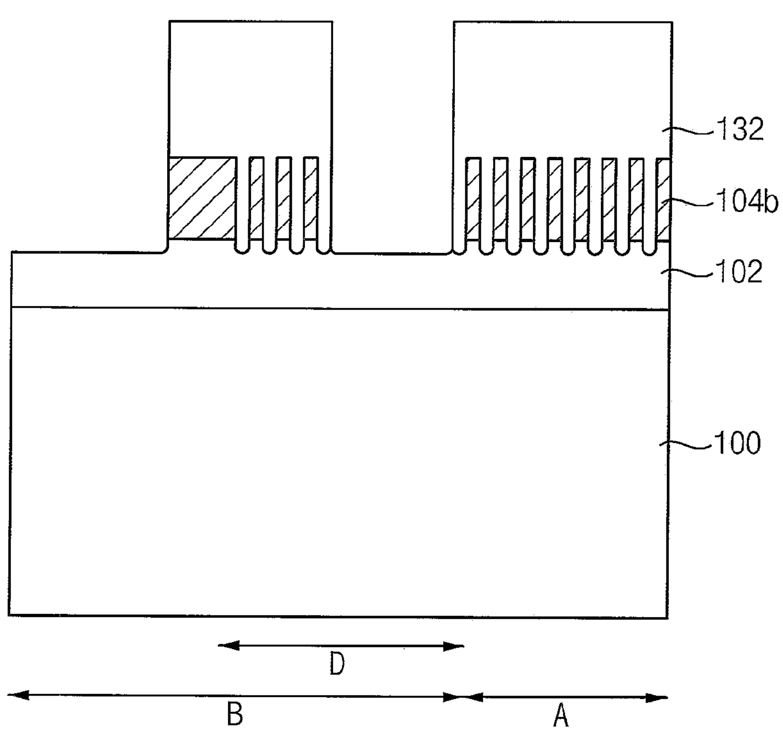

Referring to FIG. 26, the third silicon oxynitride layer 134 may be anisotropically etched using the fourth photoresist pattern 136 as an etch mask.

Subsequently, the second spin-on hard mask layer 132 may be anisotropically etched. Further, the first polysilicon pattern 104*a* and a portion of the extension portion of the first polysilicon pattern 104*a* may be anisotropically etched. Therefore, the first polysilicon pattern 104*a* exposed by the second spin-on hard mask layer 132 may be etched to form a second polysilicon pattern 104*b*. The fourth photoresist pattern 136 and the third silicon oxynitride layer 134 may be removed by the etching process.

Figure 27:
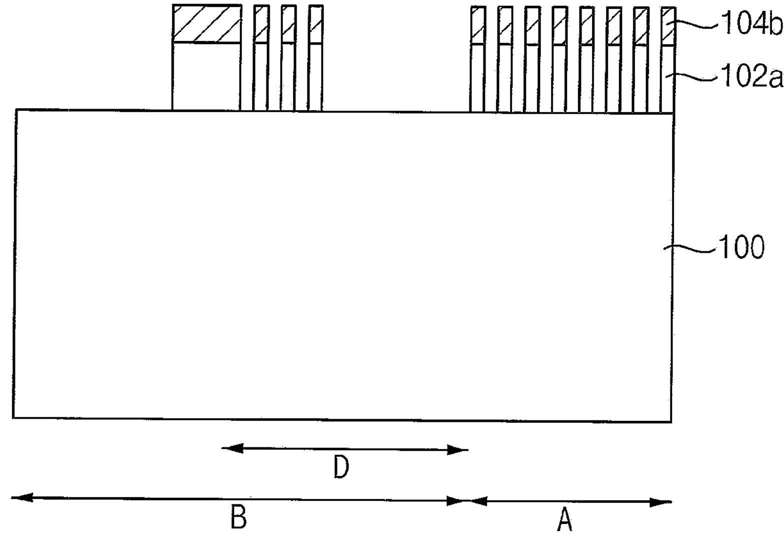

Referring to FIG. 27, the second spin-on hard mask layer 132 may be removed by an ashing process.

The first silicon oxide layer 102 may be etched using the second polysilicon pattern 104*b* as an etch mask to form a first hard mask pattern 102*a*.

The first hard mask pattern 102*a* in the memory cell region A may cover the region for forming the first active pattern. The first hard mask pattern 102*a* in the boundary region B may cover the region for forming the first and second silicon dam patterns. Although not shown, the first hard mask pattern 102*a* in the peripheral circuit region may cover the region for forming the second active pattern.

Figure 28:
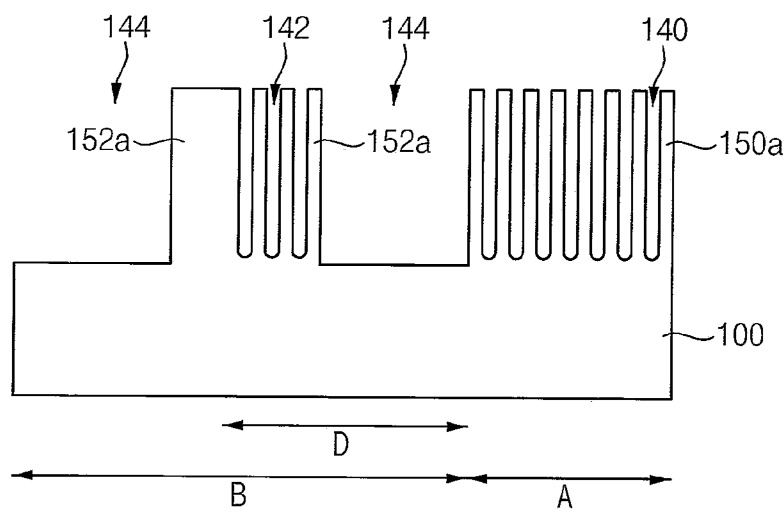

Referring to FIG. 28, upper portions of the substrate 100 may be etched using the first hard mask pattern 102*a* as an etch mask to form trenches.

A trench formed in the memory cell region A is referred to as a first trench 140, and trenches formed in the first region D are referred to as a first trench line 142 and a second trench line (not shown), respectively. A trench formed in the second region is referred to as a second trench 144. A trench formed in the peripheral circuit region is referred to as a third trench (not shown).

The first active pattern 150*a* may be formed in the memory cell region A by the etching process, and the first silicon dam pattern 182*a* and the second silicon dam pattern (not shown) may be formed in the boundary region B by the etching process. The second active pattern (not shown) may be formed in the peripheral circuit region by the etching process.

Each of the first trench line 142 and the second trench line (not shown) may extend in a direction the same as an extension direction of the first active pattern 150*a*. In addition, an inner width of each of the first trench line 142 and the second trench line (not shown) may have the first line width substantially the same as a line width of the first active pattern 150*a*.

As shown in FIG. 28, the first silicon dam pattern may be partially cut by the first trench lines 142 in the boundary region B.

Figure 29:
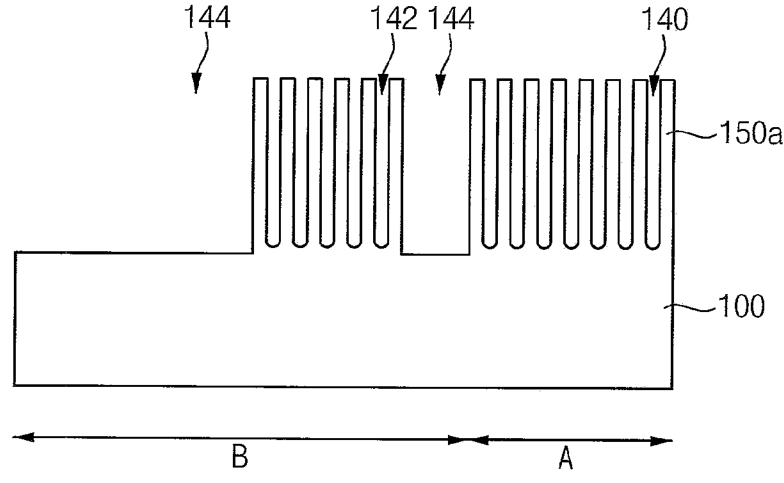

If the subsequent processes are performed after forming the fourth photoresist pattern as shown in FIG. 25, first trench lines 142 as shown in FIG. 29 may be formed. That is, the first silicon dam pattern may be completely cut by the first trench lines 142 in the boundary region B.

Figure 30:
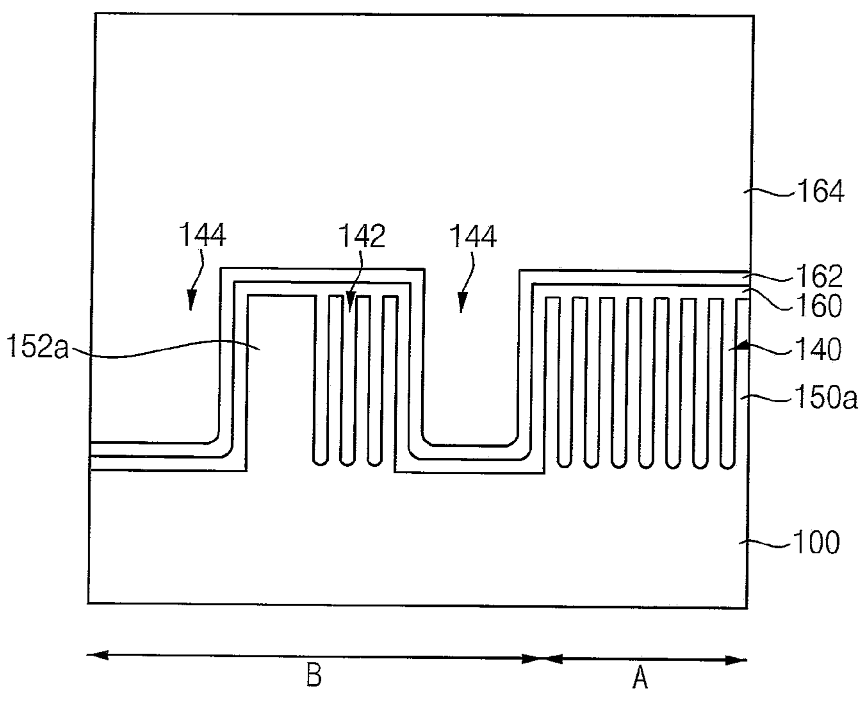

Referring to FIG. 30, an inner wall oxide layer 160 may be conformally formed on surfaces of the trenches. A liner layer 162 may be formed on the inner wall oxide layer 160. The inner wall oxide layer 160 may include or may be formed of silicon oxide. The inner wall oxide layer 160 may be formed by an atomic layer deposition (ALD) process. The liner layer 162 may include or may be formed of silicon nitride. The liner layer 162 may be formed by an atomic layer deposition process.

In example embodiments, the first trench 140 may be filled by the inner wall oxide layer 160, according to a position. In some example embodiments, the first trench 140 may be filled by the inner wall oxide layer 160 and the liner layer 162, according to a position. The inner wall oxide layer 160 may completely fill each of the first trench line 142 and the second trench line.

A filling insulation layer 164 may be formed on the liner layer 162. The filling insulation layer 164 may completely fill each of the second trench 144 and the third trench. The filling insulation layer 164 may include an oxide having excellent gap filling characteristics. The filling insulation layer 164 may be formed by coating of TOSZ. After coating of the TOSZ, the TOSZ may be densified by a wet heat treatment process. The wet heat treatment may be performed at a temperature of about 900° C. to about 1100° C.

The first trench 140, the first trench line 142 and the second trench line may be already filled by the inner wall oxide layer 160 or the inner wall oxide layer 160 and the liner layer 162, so that the filling insulation layer 164 is not formed in each of the first trench 140, the first trench line 142 and the second trench line. For example, the TOSZ is not formed in each of the first trench 140, the first trench line 142, and the second trench line.

In the heat treatment process, as a volume of the filling insulation layer 164 filling the second trench 144 may be decreased, stress may be applied to an edge portion of the memory cell region A. Therefore, the first active patterns 150*a* formed on the edge portion of the memory cell region A may be warped or bent. Accordingly, defects of the memory cells formed on the edge portion of the memory cell region A may occur.

However, in the example embodiments, the first silicon dam pattern 182*a* and the second silicon dam pattern may be formed in the boundary region B, so that an amount of the filling insulation layer 164 filling the second trench 144 in the boundary region B may be decreased. Accordingly, stress applied to the edge portion of the memory cell region A may be decreased, and warping or bending of the first active patterns 150*a* formed on the edge portion of the memory cell region A may be decreased.

As the amount of the filling insulation layer 164 filling the second trench 144 is decreased, a residual heat in the filling insulation layer 164 after the heat treatment process may be decreased. Therefore, defects caused by diffusion of the residual heat may be decreased in subsequent processes.

Figure 31:
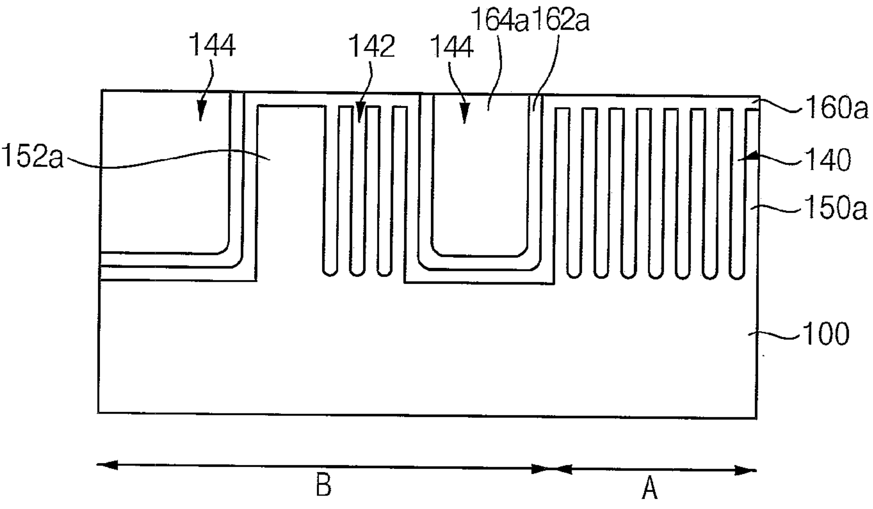

Referring to FIG. 31, the filling insulation layer 164 may be planarized until a surface of the liner layer 162 may be exposed. Thereafter, exposed liner layer 162 may be removed. Accordingly, an inner wall oxide layer pattern 160*a*, a liner pattern 162*a*, and a filling insulation pattern 164*a* may be formed in the trenches.

The inner wall oxide layer pattern 160*a* may fill the first trench 140, or the inner wall oxide layer pattern 160*a* and the liner pattern 162*a* may fill the first trench 140.

The inner wall oxide layer pattern 160*a* may fill each of the first trench line 142 and the second trench line. Therefore, a first silicon dam structure and a second silicon dam structure may be formed in the boundary region B.

The inner wall oxide layer pattern 160*a*, the liner pattern 162*a* and the filling insulation pattern 164*a* may fill the second trench 144.

Although not shown, the inner wall oxide layer pattern 160*a*, the liner pattern 162*a* and the filling insulation pattern 164*a* may fill the third trench.

As the above processes are performed, the first silicon dam structure and the second silicon dam structure excluding the filling insulation pattern may be formed in the boundary region B. Accordingly, the amount of the filling insulation pattern 164*a* formed in the boundary region B is decreased, so that defects due to the heat treatment process for densification of the filling insulation pattern 164*a* may be decreased.

Figure 32:
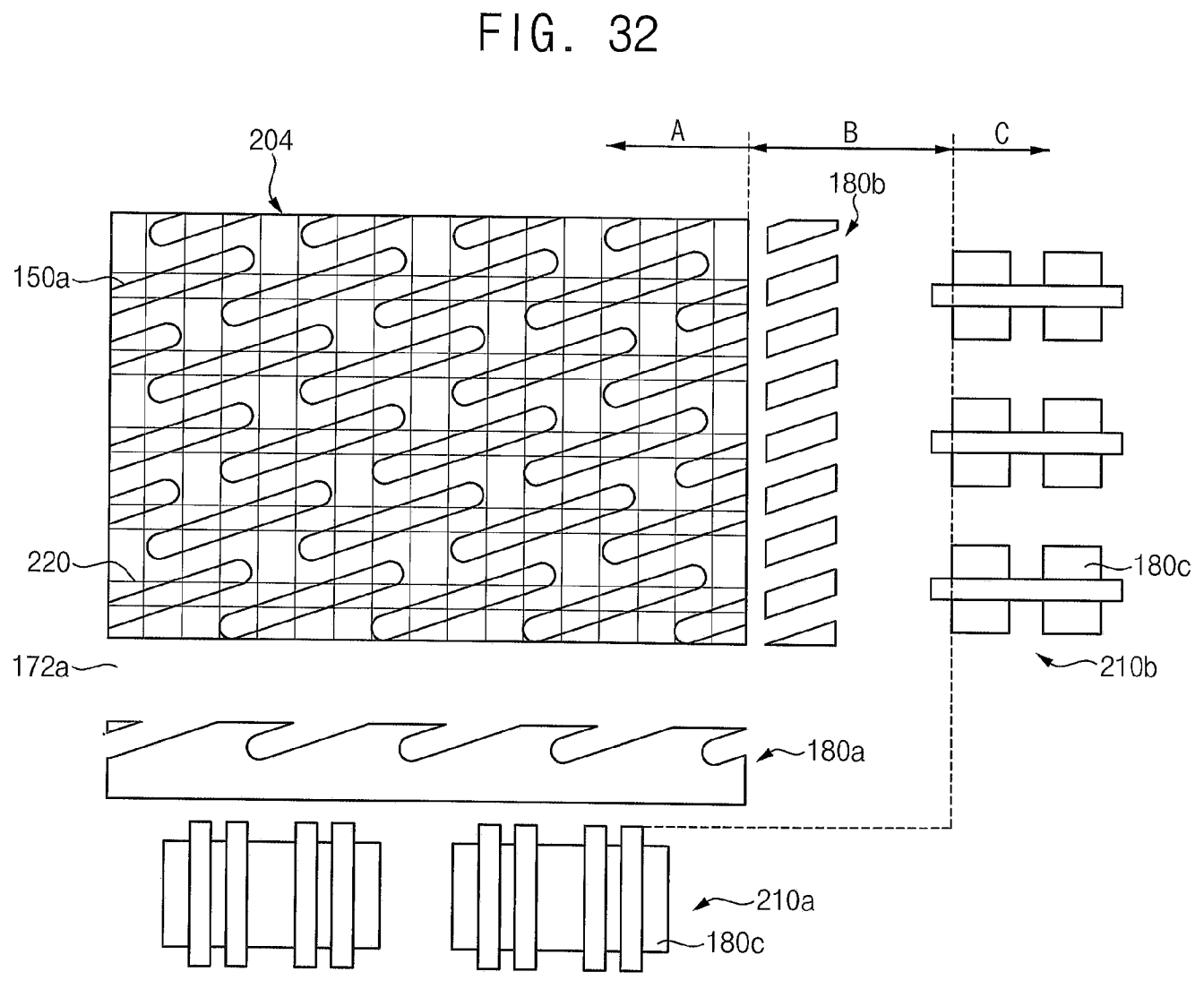
Figure 33:
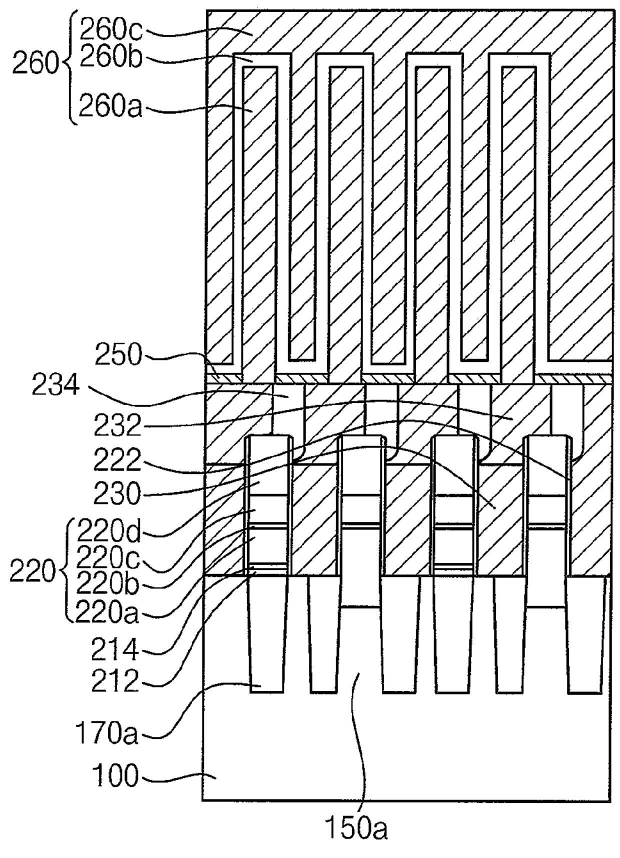

FIG. 32 is a plan view illustrating a semiconductor device in accordance with example embodiments. FIG. 33 is a cross-sectional view illustrating a portion of the semiconductor device of FIG. 32.

FIGS. 32 and 33 may include active patterns according to the example embodiments described above. The semiconductor device shown in FIGS. 32 and 33 may be a DRAM device. FIG. 33 is a cross-sectional view of a memory cell region in a semiconductor device.

Referring to FIGS. 32 and 33, the substrate may include the memory cell region A, the peripheral circuit region C, and the boundary region B between the memory cell region A and the peripheral circuit region C.

The first isolation pattern 170*a* and the first active pattern 150*a* may be formed at the substrate of the memory cell region A. The second isolation pattern 172*a* and the silicon dam structures 180*a* and 180*b* may be formed at the substrate of the boundary region B. The third isolation pattern 170*c* and the second active pattern 180*c* may be formed at the substrate of the peripheral circuit region C.

The silicon dam structures 180*a* and 180*b* formed at the substrate of the boundary region B may be the same as those described with reference to FIG. 1. However, the silicon dam structure may be not limited thereto, and the silicon dam structure may be the same as one of the silicon dam structures described with reference to FIGS. 3 to 8.

Selection transistors, bit line structures 220 and cell capacitors 260 may be formed on the substrate 100 of the memory cell region A. A unit memory cell may include one selection transistor and one cell capacitor 260.

Transistors and wirings for configuring the peripheral circuit may be formed on the peripheral circuit region C of the substrate 100 of. The peripheral circuit region C may include the first peripheral circuit region spaced apart from an edge in the first direction in the memory cell region A and the second peripheral circuit region spaced apart from an edge in the second direction in the memory cell region A. Circuits 210*a* constituting the sub word line drive SWD may be disposed in the first peripheral circuit region. Circuits 210*b* constituting a sense amplifier may be disposed in the second peripheral circuit region.

A memory cell structure formed on the substrate 100 of the memory cell region A may be described.

The substrate may include a gate trench extending in the first direction parallel to an upper surface of the substrate 100. A gate structure 204 may be formed in the gate trench. The gate structure 204 may serve as a word line.

In example embodiments, the gate structure 204 may include a gate insulation layer, a gate electrode, and a capping insulation pattern. A plurality of the gate structures 204 may be arranged in the second direction that may be a direction parallel to the surface of the substrate and perpendicular to the first direction.

Impurity regions serving as source/drain regions may be formed at the substrate 100 of the active region between the gate structures 204. For example, the impurity regions may include a first impurity region electrically connected to the bit line structure 220 and a second impurity region electrically connected to the cell capacitor. The gate structure 204 and the impurity regions may serve as the selection transistor.

A pad insulation pattern 212 and a first etch stop layer pattern 214 may be formed on the first active pattern 150*a*, the first isolation layer pattern 170*a* and the gate structure 204. For example, the pad insulation pattern 212 may include, e.g., an oxide such as silicon oxide, and the first etch stop layer pattern 214 may include, e.g., a nitride such as silicon nitride.

A portion of the substrate 100 on which the pad insulation pattern 212 and the first etch stop layer pattern 214 are not formed may include a recess. A top surface of the first impurity region may be exposed by a bottom of the recess.

The bit line structure 220 may be formed on the first etch stop layer pattern 214 and the recess. The bit line structure 220 may include a conductive pattern 220*a*, a barrier metal pattern 220*b*, a metal pattern 220*c*, and a hard mask pattern 220*d*. The conductive pattern 220*a* may include, e.g., polysilicon doped with impurities.

The polysilicon included in the bit line structure 220 may be oxidized or melted by the residual heat in the filling insulation pattern in the boundary region B. In example embodiments, the silicon dam structures 180*a* and 180*b* may be formed in the boundary region B, and, as a result, the amount of the filling insulation pattern in the boundary region B may be decreased. Accordingly, defects in which the polysilicon included in the bit line structure 220 may be oxidized or melted may be decreased. Further, defects in which a lower line width of the bit line structure 220 may be decreased by the oxidation or melting may be reduced.

The bit line structures 220 may extend in the second direction, and a plurality of the bit line structures 220 may be arranged in the first direction. In example embodiments, a spacer 222 may be formed on a sidewall of the bit line structure 220.

A first interlayer insulation layer (not illustrated) may be formed to fill a gap between the bit line structures 220.

A contact plug 230 may be formed through the first interlayer insulation layer, the first etch stop layer pattern 214 and the pad insulation pattern 212, and the contact plug 230 may contact the second impurity region. A landing pad 232 may be formed on the contact plug 230. The contact plug 230 and the landing pad 232 may serve as a contact plug structure.

The contact plug 230 may be formed between the bit line structures 220. An insulation pattern 234 may be formed between the landing pads 232.

A second etch stop layer 250 may be formed on the landing pad 232, the insulation pattern 234 and the first interlayer insulation layer. The cell capacitor 260 may be formed through the second etch stop layer 250, and may contact the landing pad 232. The cell capacitor 260 may include a lower electrode 260*a*, a dielectric layer 260*b*, and an upper electrode 260*c*.

Actual circuits capable of operation may not be formed on the silicon dam structures 180*a* and 180*b*. Accordingly, in example embodiments, contact plugs may not be formed on the silicon dam structures 180*a* and 180*b*.

In the DRAM device, the silicon dam structures 180*a* and 180*b* may be formed in the boundary region B, so that defects may be decreased.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:

a substrate extending in a first direction and a second direction perpendicular to the first direction, the substrate including a memory cell region, a peripheral circuit region, and a boundary region between the memory cell region and the peripheral circuit region, the memory cell region when viewed in a plan view having a first straight horizontal edge portion extending in the second direction and a second straight horizontal edge portion extending in the first direction;

first active patterns in the memory cell region, each of the first active patterns extending in a third direction oblique to the first direction; and a first silicon dam structure in the boundary region adjacent to the first straight horizontal edge portion of the memory cell region in the first direction, and the first silicon dam structure extends in the second direction, a second silicon dam structure in the boundary region adjacent to the second straight horizontal edge portion of the memory cell region in the second direction, and the second silicon dam structure extends in the first direction, wherein the first silicon dam structure includes a first silicon dam pattern including first trench lines and a first dam isolation pattern in the first trench lines, wherein the second silicon dam structure includes a second silicon dam pattern including second trench lines and a second dam isolation pattern in the second trench lines, wherein, when viewed in a plan view, the first silicon dam pattern and the second silicon dam pattern are spaced apart from the first active patterns, wherein, when viewed in the plan view, the first silicon dam pattern and the second silicon dam pattern are spaced apart from edges of the memory cell region, wherein, when viewed in the plan view, the first trench lines partially extend through the first silicon dam pattern in the third direction, and wherein, when viewed in the plan view, the second trench lines completely extend through the second silicon dam pattern in the third direction.

2. The semiconductor device of claim 1, wherein each of the first active patterns has a first line width, and an inner width of the first trench lines is the same as the first line width.

3. The semiconductor device of claim 1, further comprising:

a first isolation trench disposed between the first silicon dam structure and the memory cell region in the first direction; and a second isolation trench disposed between the second silicon dam structure and the memory cell region in the second direction, wherein the first isolation trench and the second isolation trench include an isolation pattern therein, and a first width of the first isolation trench in the first direction is greater than a second width of the second isolation trench in the second direction.

4. The semiconductor device of claim 3, further comprising:

a third isolation trench disposed between the first silicon dam structure and the peripheral circuit region; and a fourth isolation trench disposed between the second silicon dam structure and the peripheral circuit region, wherein the third isolation trench and the fourth isolation trench include an isolation pattern therein, and a third width of the third isolation trench in the first direction is less than a fourth width of the fourth isolation trench in the second direction.

5. The semiconductor device of claim 3, wherein the first silicon dam structure includes a plurality of first silicon dam patterns, wherein the first silicon dam patterns are arranged in the second direction to be spaced apart from each other in the second direction, and wherein each of the first silicon dam patterns includes first trench lines extending in the third direction.

6. The semiconductor device of claim 1, wherein a third distance from the memory cell region to a first side of the second silicon dam structure facing the memory cell region is less than a fourth distance from the peripheral circuit region to a second side of the second silicon dam structure facing the peripheral circuit region.

7. The semiconductor device of claim 3, wherein an end of the first silicon dam structure and an end of the second silicon dam structure are spaced apart from each other.

8. The semiconductor device of claim 3, wherein an end of the first silicon dam structure and an end of the second silicon dam structure are connected to each other, and the first silicon dam structure and the second silicon dam structure form a frame shape surrounding the memory cell region.

9. The semiconductor device of claim 3, wherein the first dam isolation pattern and the second dam isolation pattern include only an inner wall oxide layer pattern, and the isolation pattern includes the inner wall oxide layer pattern, a liner pattern, and a filling insulation pattern.

10. The semiconductor device of claim 9, wherein the filling insulation pattern includes Tonen silazane (TOSZ).

11. A semiconductor device, comprising:

a substrate extending in a first direction and a second direction perpendicular to the first direction, the substrate including a memory cell region, a peripheral circuit region, and a boundary region between the memory cell region and the peripheral circuit region, the memory cell region when viewed in a plan view having a first straight horizontal edge portion extending in the second direction and a second straight horizontal edge portion extending in the first direction;

first active patterns in the memory cell region, each of the first active patterns extending in a third direction oblique to the first direction;

a first silicon dam structure extending in the second direction and positioned in the boundary region adjacent to the first straight horizontal edge portion of the memory cell region in the first direction, the first silicon dam structure including a first silicon dam pattern including first trench lines extending in the third direction and a first dam isolation pattern in the first trench lines;

a second silicon dam structure extending in the first direction and positioned in the boundary region adjacent to the second straight horizontal edge portion of the memory cell region in the second direction, the second silicon dam structure including a second silicon dam pattern including second trench lines extending in the third direction and a second dam isolation pattern in the second trench lines; and an isolation pattern positioned in the boundary region in addition to the first and second silicon dam structures, wherein, when viewed in a plan view, the first silicon dam pattern and the second silicon dam pattern are spaced apart from the first active patterns, wherein, when viewed in the plan view, the first silicon dam pattern and the second silicon dam pattern are spaced apart from edges of the memory cell region, wherein, when viewed in the plan view, the first trench lines partially extend through the first silicon dam pattern in the third direction, and wherein, when viewed in the plan view, the second trench lines completely extend through the second silicon dam pattern in the third direction.

12. The semiconductor device of claim 11, further comprising:

a first isolation trench disposed between the first silicon dam structure and the memory cell region in the first direction; and a second isolation trench disposed between the second silicon dam structure and the memory cell region in the second direction, wherein the first isolation trench and the second isolation trench include an isolation pattern therein, and a first width of the first isolation trench in the first direction is greater than a second width of the second isolation trench in the second direction.

13. The semiconductor device of claim 11, wherein the first silicon dam pattern is one of a plurality of first silicon dam patterns that are included in the first silicon dam structure, wherein the first silicon dam patterns are arranged in the second direction to be spaced apart from each other in the second direction, and wherein the first trench lines are formed in at least a portion of the first silicon dam patterns.

14. The semiconductor device of claim 11, further comprising:

a third isolation trench disposed between the first silicon dam structure and the peripheral circuit region; and a fourth isolation trench disposed between the second silicon dam structure and the peripheral circuit region, wherein the third isolation trench and the fourth isolation trench include an isolation pattern therein, and a third width of the third isolation trench in the first direction is less than a fourth width of the fourth isolation trench in the second direction.

15. The semiconductor device of claim 11, wherein the first and second dam isolation patterns include only an inner wall oxide layer pattern, and the isolation pattern includes the inner wall oxide layer pattern, a liner pattern, and a filling insulation pattern.

16. The semiconductor device of claim 15, wherein the filling insulation pattern includes Tonen silazane (TOSZ).

17. A semiconductor device, comprising:

a substrate extending in a first direction and a second direction perpendicular to the first direction, the substrate including a memory cell region, a peripheral circuit region, and a boundary region between the memory cell region and the peripheral circuit region, the memory cell region when viewed in a plan view having a first straight horizontal edge portion extending in the second direction and a second straight horizontal edge portion extending in the first direction;

first active patterns in the memory cell region, each of the first active patterns extending in a third direction oblique to the first direction;

a first silicon dam structure extending in the second direction and positioned in the boundary region adjacent to the first straight horizontal edge portion of the memory cell region in the first direction, the first silicon dam structure including a first silicon dam pattern including first trench lines extending in the third direction and a first dam isolation pattern in the first trench lines;

a second silicon dam structure extending in the first direction and positioned in the boundary region adjacent to the second straight horizontal edge portion of the memory cell region in the second direction, the second silicon dam structure including a second silicon dam pattern including second trench lines extending in the third direction and a second dam isolation pattern in the second trench lines;

a gate structure in the memory cell region, the gate structure extending in the first direction;

bit line structures in the memory cell region, the bit line structures extending in the second direction, and the bit line structures including a polysilicon pattern;

a contact plug structure disposed between the bit line structures in the memory cell region; and a capacitor on the contact plug structure, the capacitor being electrically connected to the contact plug structure, wherein, when viewed in a plan view, the first silicon dam pattern and the second silicon dam pattern are spaced apart from the first active patterns, wherein, when viewed in the plan view, the first silicon dam pattern and the second silicon dam pattern are spaced apart from edges of the memory cell region, wherein, when viewed in the plan view, the first trench lines partially extend through the first silicon dam pattern in the third direction, and wherein, when viewed in the plan view, the second trench lines completely extend through the second silicon dam pattern in the third direction.

18. The semiconductor device of claim 17, wherein each of the first active patterns has a first line width, and an inner width of each of the first trench lines and the second trench lines is the same as the first line width.

* * * * *